(12) United States Patent
Lyu et al.

(10) Patent No.: US 7,879,462 B2
(45) Date of Patent: Feb. 1, 2011

(54) AMINOSTYRYL COMPOUND, METHOD OF PREPARING THE SAME, AND ORGANIC LIGHT EMITTING DEVICE USING THE AMINOSTYRYL COMPOUND

(75) Inventors: Yi-Yeol Lyu, Yongin-si (KR); Byoung-Ki Choi, Hwaseong-si (KR); Myeong-Suk Kim, Suwon-si (KR); Sung-Hun Lee, Seoul (KR); Jong-Jin Park, Guri-si (KR); Young-Hun Byun, Yongin-si (KR); Lyong-Sun Pu, Suwon-si (KR)

(73) Assignee: Samsung Mobile Display Co., Ltd., Yongin, Gyeonggi-Do (KR)

( * ) Notice: Subject to any disclaimer, the term of this patent is extended or adjusted under 35 U.S.C. 154(b) by 1175 days.

(21) Appl. No.: 11/386,662

(22) Filed: Mar. 23, 2006

(65) Prior Publication Data
US 2006/0246317 A1   Nov. 2, 2006

(30) Foreign Application Priority Data
Apr. 30, 2005   (KR) .................. 10-2005-0036534

(51) Int. Cl.
 *H01L 51/54* (2006.01)
(52) U.S. Cl. .................. 428/690; 428/917; 313/504; 564/431
(58) Field of Classification Search .................. None
See application file for complete search history.

(56) References Cited

U.S. PATENT DOCUMENTS

| | | | |
|---|---|---|---|
| 4,957,838 A | | 9/1990 | Aruga |
| 5,307,363 A | * | 4/1994 | Hosokawa et al. ............. 372/53 |
| 5,932,383 A | * | 8/1999 | Nakata et al. ............. 430/58.75 |
| 2004/0202891 A1 | * | 10/2004 | Ishibashi et al. ............. 428/690 |

FOREIGN PATENT DOCUMENTS

| | | | |
|---|---|---|---|
| JP | 05-017765 | | 1/1993 |
| JP | 05-112497 | * | 5/1993 |
| JP | 05112499 A | * | 5/1993 |
| JP | 2005-099255 A | | 4/2005 |

OTHER PUBLICATIONS

Adv. Matter. 2005, 17, p. 2493-2497: Lee et. al., "Highly Efficient Deep-Blue Doped Organic Light-Emitting Devices".*
English Translation of JP 05112499 A.*
English Translation of JP 05-112497.*
Chinese Office Action issued on Nov. 27, 2009, corresponding to the Chinese Patent Application No. 200610077205.5.
Reference from CAPLUS database cited in the Chinese Office Action issued on Nov. 27, 2009, corresponding the Chinese Patent Application No. 200610077205.5.
Wikipedia, Biphenyl, http://en.wikipedia.org/wiki/Biphenyl (Printed out on Jun. 16, 2010).
Wikipedia, Biphenylene, http://en.wikipedia.org/wiki/Biphenylene (Printed out on Jun. 16, 2010).

* cited by examiner

*Primary Examiner*—D. Lawrence Tarazano
*Assistant Examiner*—Gregory Clark
(74) *Attorney, Agent, or Firm*—Robert E. Bushnell, Esq.

(57) ABSTRACT

An aminostyryl compound represented by Formula 1:

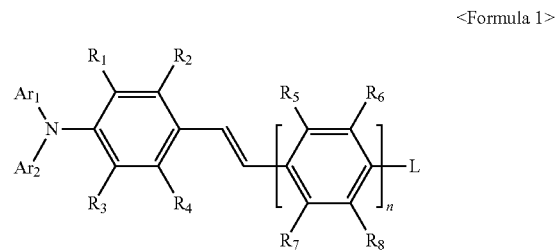

<Formula 1>

The organic light emitting device using the aminostyryl compound exhibits low driving voltage and improved brightness, efficiency, and color purity.

19 Claims, 2 Drawing Sheets

FIG. 1A

| SECOND ELECTRODE |
| :---: |
| ELECTRON INJECTION LAYER |
| ELECTRON TRANSPORT LAYER |
| EMISSIVE LAYER |
| HOLE INJECTION LAYER |
| FIRST ELECTRODE |

FIG. 1B

| SECOND ELECTRODE |
| :---: |
| ELECTRON INJECTION LAYER |
| ELECTRON TRANSPORT LAYER |
| EMISSIVE LAYER |
| HOLE TRANSPORT LAYER |
| HOLE INJECTION LAYER |
| FIRST ELECTRODE |

AMINOSTYRYL COMPOUND, METHOD OF PREPARING THE SAME, AND ORGANIC LIGHT EMITTING DEVICE USING THE AMINOSTYRYL COMPOUND

CROSS-REFERENCE TO RELATED PATENT APPLICATIONS AND CLAIM OF PRIORITY

This application claims the benefit of Korean Patent Application No. 10-2005-0036534, filed on Apr. 30, 2005, in the Korean Intellectual Property Office, the disclosure of which is incorporated herein in its entirety by reference.

BACKGROUND OF THE INVENTION

1. Field of the Invention

The present invention relates to an aminostyryl compound, to a method of preparing the same, and to an organic light emitting device using the aminostyryl compound, and more particularly, to an aminostyryl compound which has excellent electric properties and thermal stability such that an organic light emitting device using the aminostyryl compound has low driving voltage, excellent brightness, efficiency and color purity, to a method of preparing the same, and to an organic light emitting device including an organic layer formed of the aminostyryl compound.

2. Description of the Related Art

Light emitting devices, which are self-emitting devices, have wide viewing angles, excellent contrast, and quick response. Examples of light emitting devices include inorganic light emitting devices, which include emitting layers formed of an inorganic compound, and organic light emitting devices, which include emitting layers formed of an organic compound. Organic light emitting devices are brighter, and have a lower operating voltage and a quicker response compared to inorganic light emitting devices. Furthermore, organic light emitting devices can realize multi colors. Due to these advantages of organic light emitting devices, many studies on organic light emitting devices are being carried out.

Typically, an organic light emitting device has a structure of anode/organic emissive layer/cathode. An organic light emitting device also has various other structures, such as anode/hole injection layer/hole transport layer/emissive layer/electron transport layer/electron injection layer/cathode or anode/hole injection layer/hole transport layer/emissive layer/hole blocking layer/electron transport layer/electron injection layer/cathode.

A material that is used to form the emissive layer can be, for example, an aminostyryl compound disclosed in Japanese Patent Laid-open Publication No. 1993-017765. However, the driving voltage, brightness, efficiency and color purity of an organic light emitting device using, such as, the aminostyryl compound do not meet desired levels. Accordingly, these properties must be improved.

SUMMARY OF THE INVENTION

The present invention provides an aminostyryl compound that can improve driving voltage, brightness, efficiency and color purity of an organic light emitting device, a method of preparing the same, and an organic light emitting device using the aminostyryl compound.

According to an aspect of the present invention, there is provided an aminostyryl compound represented by Formula 1

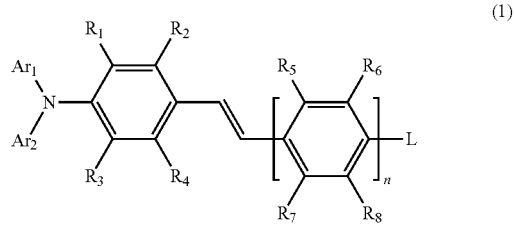

(1)

where $Ar_1$ and $Ar_2$ are each independently a substituted or unsubstituted $C_6$-$C_{30}$ aryl group, or a substituted or unsubstituted $C_2$-$C_{30}$ heteroaryl group;

$R_1$, $R_2$, $R_3$, $R_4$, $R_5$, $R_6$, $R_7$, and $R_8$ are each independently hydrogen, a substituted or unsubstituted $C_1$-$C_{20}$ alkyl group, or a substituted or unsubstituted $C_1$-$C_{20}$ alkoxy group;

n is 1, 2 or 3; and

L is a substituted or unsubstituted $C_6$-$C_{30}$ aryl group, a substituted or unsubstituted $C_2$-$C_{30}$ heteroaryl group, a substituted or unsubstituted $C_5$-$C_{20}$ cycloalkyl group, or a substituted or unsubstituted $C_5$-$C_{30}$ heterocycloalkyl group.

According to another aspect of the present invention, there is provided a method of preparing a compound represented by Formula 1, the method including: reacting a compound represented by Formula 1a with a compound represented by Formula 1b to produce a compound represented by formula 1c; and reacting the compound represented by formula 1c with compounds represented by Formula 1d to produce the compound represented by Formula 1:

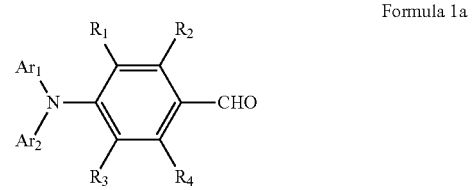

Formula 1a

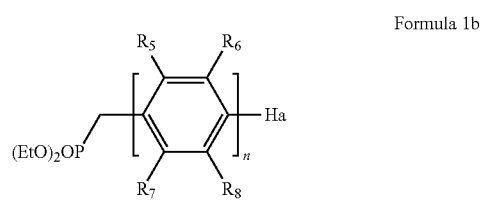

Formula 1b

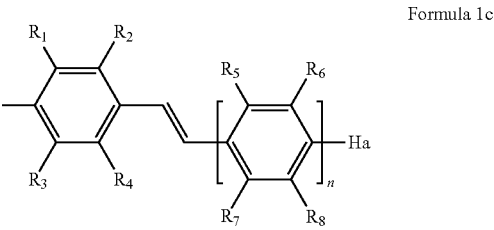

Formula 1c

Formula 1d

-continued

Formula 1

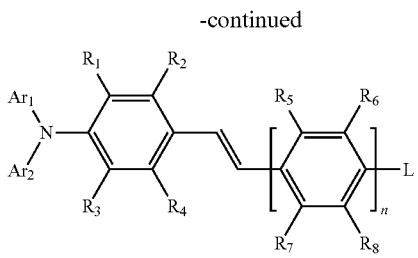

where $Ar_1$, $Ar_2$, $R_1$, $R_2$, $R_3$, $R_4$, $R_5$, $R_6$, $R_7$, $R_8$, n, and L are already described; Ha is halogen; and Q is a B-containing group.

According to yet another aspect of the present invention, there is provided an organic light emitting device including a first electrode; a second electrode; and at least an organic layer which is formed of the aminostyryl compound described above and interposed between the first electrode and the second electrode.

The organic light emitting device using the aminostyryl compound of the present invention exhibits low driving voltage, improved brightness, efficiency, and color purity.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein:

FIGS. 1A through 1C are schematic sectional views of organic light emitting devices according to embodiments of the present invention.

DETAILED DESCRIPTION OF THE INVENTION

Figure 1C:
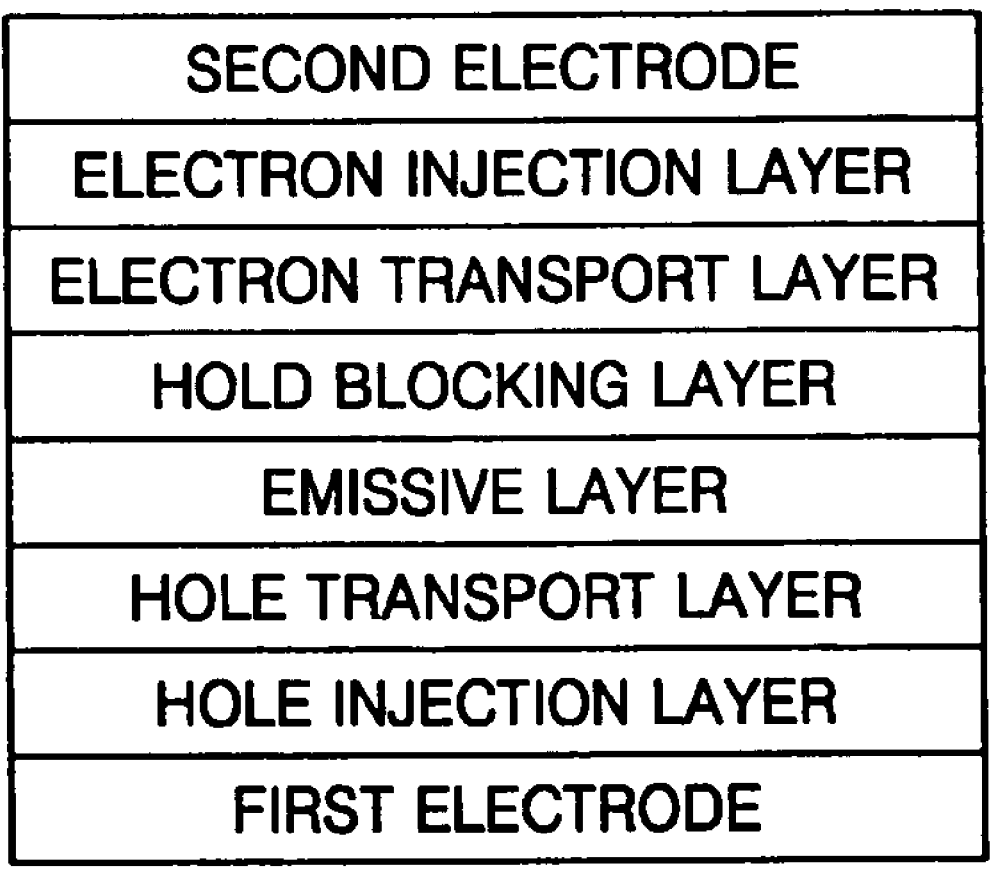

An aminostyryl compound according to an embodiment of the present invention is represented by Formula 1 where n phenylene groups (that is, a phenylene group that is not connected to N) is connected to L which is a substituted or unsubstituted $C_6$-$C_{30}$ aryl group, a substituted or unsubstituted $C_2$-$C_{30}$ heteroaryl group, a substituted or unsubstituted $C_5$-$C_{20}$ cycloalkyl group, or a $C_5$-$C_{30}$ substituted or unsubstituted heterocycloalkyl group:

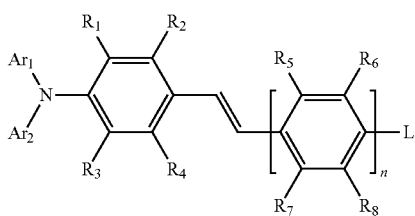

(1)

where $Ar_1$ and $Ar_2$ are each independently a substituted or unsubstituted $C_6$-$C_{30}$ aryl group, or a substituted or unsubstituted $C_2$-$C_{30}$ heteroaryl group;

$R_1$, $R_2$, $R_3$, $R_4$, $R_5$, $R_6$, $R_7$, and $R_8$ are each independently hydrogen, a substituted or unsubstituted $C_1$-$C_{20}$ alkyl group, or a substituted or unsubstituted $C_1$-$C_{20}$ alkoxy group;

n is 1, 2 or 3; and

L is a substituted or unsubstituted $C_6$-$C_{30}$ aryl group, a substituted or unsubstituted $C_2$-$C_{30}$ heteroaryl group, a substituted or unsubstituted $C_5$-$C_{20}$ cycloalkyl group, or a substituted or unsubstituted $C_5$-$C_{30}$ heterocycloalkyl group.

Thus, the solubility of the aminostyryl compound can be decreased, and when the aminostyryl compound is used in a device, the driving voltage of the device decreases and its efficiency increases. Accordingly, the aminostyryl compound represented by Formula 1 is suitable for forming an organic layer of an organic light emitting device, in particular, as a dopant of an emissive layer, or a hole transport layer.

In Formula 1, hydrogen of an aryl group or a heteroaryl group which can be $Ar_1$ or $Ar_2$; an alkyl group or alkoxy group which can be $R_1$, $R_2$, $R_3$, $R_4$, $R_5$, $R_6$, $R_7$ or $R_8$; an aryl group, a heteroaryl group, a cycloalkyl group, or a heterocycloalkyl group which can be L can be unsubstituted or substituted with a proper substituent. The substituent may include at least one selected from the group consisting of —F; —Cl; —Br; —CN; —$NO_2$; —OH; a $C_1$-$C_{20}$ alkyl group that is unsubstituted or substituted with —F, —Cl, —Br, —CN, —$NO_2$ or —OH; a $C_1$-$C_{20}$ alkoxy group that is unsubstituted or substituted with —F, —Cl, —Br, —CN, —$NO_2$ or —OH; a $C_6$-$C_{30}$ aryl group that is unsubstituted or substituted with —F, —Cl, —Br, —CN, —$NO_2$ or —OH; a $C_2$-$C_{30}$ heteroaryl group that is unsubstituted or substituted with —F, —Cl, —Br, —CN, —$NO_2$ or —OH; a $C_5$-$C_{20}$ cycloalkyl group that is unsubstituted or substituted with —F, —Cl, —Br, —CN, —$NO_2$ or —OH; and a $C_5$-$C_{30}$ heterocycloalkyl group that is unsubstituted or substituted with —F, —Cl, —Br, —CN, —$NO_2$ or —OH, but the substituent is not limited to these materials.

Preferably, in Formula 1, $Ar_1$ and $Ar_2$ are each independently selected from the group consisting of a phenyl group, a $C_1$-$C_{10}$ alkylphenyl group, a $C_1$-$C_{10}$ alkoxyphenyl group, a halophenyl group, a cyanophenyl group, a dicyanophenyl group, a trifluoromethoxyphenyl group, o-, m-, or p-tolyl group, o-, m- or p-cumenyl group, a mesityl group, a phenoxyphenyl group, a (α,α-dimethylbenzen)phenyl group, a (N,N'-dimethyl)aminophenyl group, a (N,N'-diphenyl)aminophenyl group, a ($C_1$-$C_{10}$ alkylcyclohexyl)phenyl group, a (anthracenyl)phenyl group, a biphenyl group, a $C_1$-$C_{10}$ alkylbiphenyl group, a $C_1$-$C_{10}$ alkoxybiphenyl group, a pentalenyl group, an indenyl group, a naphtyl group, a $C_1$-$C_{10}$ alkylnaphtyl group, a $C_1$-$C_{10}$ alkoxynaphtyl group, a halonaphtyl group, a cyanonaphtyl group, a biphenylenyl group, a $C_1$-$C_{10}$ alkyl biphenylenyl group, a $C_1$-$C_{10}$ alkoxy biphenylenyl group, an anthracenyl group, an azulenyl group, a heptalenyl group, an acenaphtylenyl group, a phenalenyl group, a fluorenyl group, an anthraquinolyl group, a methylanthryl group, a phenanthrenyl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, an ovalenyl group, a carbazolyl group, a $C_{1-10}$ alkyl carbazolyl group, a thiophenyl group, an indolyl group, a purinyl group, a benzimidazolyl group, a quinolinyl group, a benzothiophenyl group, a parathiazinyl group, a pyrroyl group, a pyrazolyl group, an imidazolyl group, an imidazolinyl group, an oxazolyl group, a thiozolyl group, a triazolyl group, a tetrazolyl group, an oxadiazolyl group, a pyridinyl group, a pyridazinyl group, a pyrimidinyl group, a pyrazinyl group, and a thianthrenyl group. However, $Ar_1$ and $Ar_2$ are not limited to these compounds.

In an embodiment of the present invention, $Ar_1$ and $Ar_2$ can be identical, and preferably, $Ar_1$ and $Ar_2$ are phenyl groups or naphtyl groups.

Preferably, in Formula 1, n may be 1 or 2.

Preferably, in Formula 1, L may be selected from the group consisting of a phenyl group, a $C_1$-$C_{10}$ alkylphenyl group, a $C_1$-$C_{10}$ alkoxyphenyl group, a halophenyl group, a cyanophenyl group, a dicyanophenyl group, a trifluoromethoxyphenyl group, o-, m-, or p-tolyl group, o-, m- or p-cumenyl group, a mesityl group, a phenoxyphenyl group, a ($\alpha,\alpha$-dimethylbenzen)phenyl group, a (N,N'-dimethyl)aminophenyl group, a (N,N'-diphenyl)aminophenyl group, a ($C_1$-$C_{10}$ alkylcyclohexyl)phenyl group, a (anthracenyl)phenyl group, a biphenyl group, a $C_1$-$C_{10}$ alkylbiphenyl group, a $C_1$-$C_{10}$ alkoxybiphenyl group, a pentalenyl group, an indenyl group, a naphtyl group, a $C_1$-$C_{10}$ alkylnaphtyl group, a $C_1$-$C_{10}$ alkoxynaphtyl group, a halonaphtyl group, a cyanonaphtyl group, a biphenylenyl group, a $C_1$-$C_{10}$ alkyl biphenylenyl group, a $C_1$-$C_{10}$ alkoxy biphenylenyl group, an anthracenyl group, an azulenyl group, a heptalenyl group, an acenaphtylenyl group, a phenalenyl group, a fluorenyl group, an anthraquinolyl group, a methylanthryl group, a phenanthrenyl group, a triphenylenyl group, a pyrenyl group, a chrysenyl group, an ethylchrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, an ovalenyl group, a carbazolyl group, a $C_1$-$C_{10}$ alkyl carbazolyl group, a thiophenyl group, an indolyl group, a purinyl group, a benzimidazolyl group, a quinolinyl group, a benzothiophenyl group, a parathiazinyl group, a pyrroyl group, a pyrazolyl group, an imidazolyl group, an imidazolinyl group, an oxazolyl group, a thiozolyl group, a triazolyl group, a tetrazolyl group, an oxadiazolyl group, a pyridinyl group, a pyridazinyl group, a pyrimidinyl group, a pyrazinyl group, a thianthrenyl group, a cyclopentyl group, a cyclohexyl group, a $C_1$-$C_{10}$ alkylcyclohexyl group, a $C_1$-$C_{10}$ alkoxycyclohexyl group, an oxyranyl group, a pyrrolidinyl group, a pyrazolidinyl group, an imidazolidinyl group, a piperidinyl group, a piperazinyl group, and a morpholinyl group. However, L is not limited to these compounds.

According to an embodiment of the present invention, L can be more preferably a naphtyl group, a biphenyl group, an anthracenyl group, a phenanthrenyl group, a pyridinyl group, a benzothiophenyl group, a thianthrenyl group, or a propylcyclohexyl.

Preferably, the aminostyryl compound according to an embodiment of the present invention may be represented by Formulae 2 thorough 10, but is not limited thereto:

Formula 2

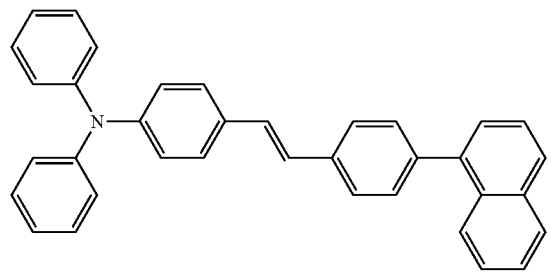

Formula 3

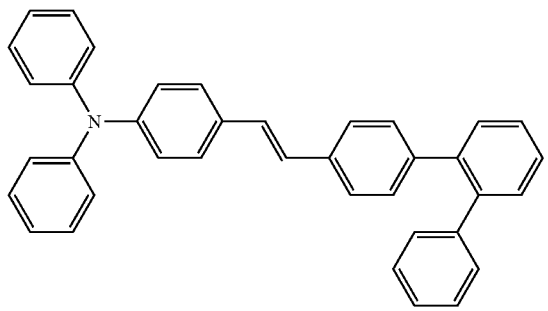

Formula 4

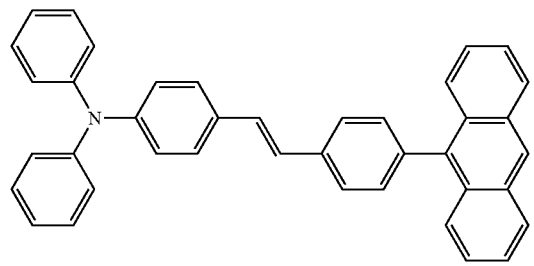

Formula 5

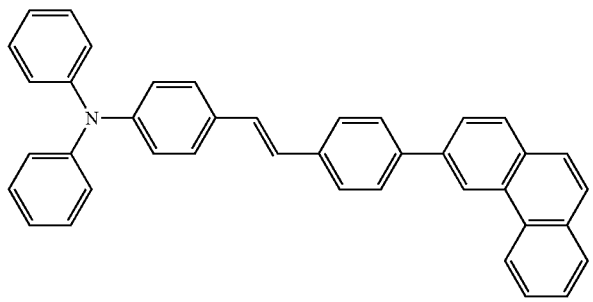

Formula 6

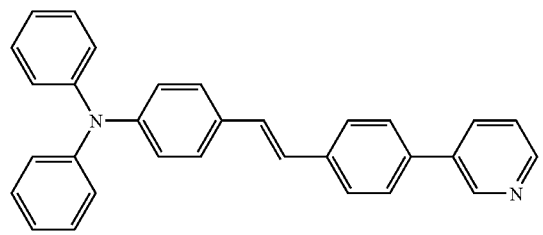

Formula 7

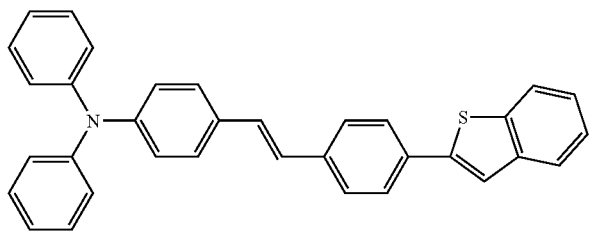

-continued

Formula 8

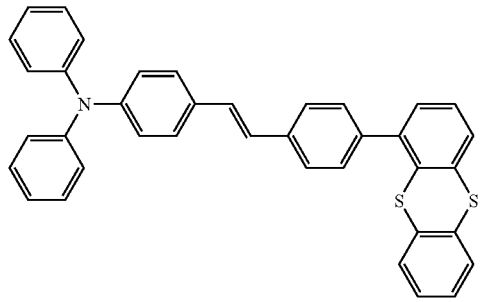

Formula 9

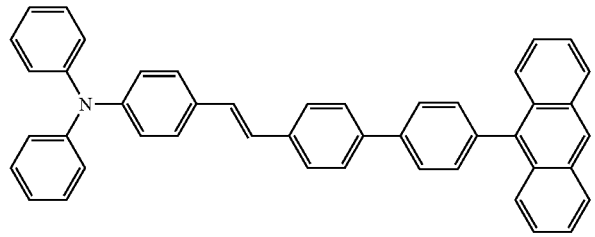

Formula 10

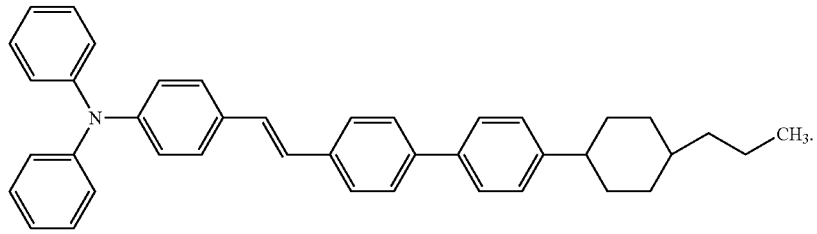

The aminostyryl compound represented by Formula 1 can be synthesized using a conventional organic synthesis method. A method of preparing the aminostyryl compound according to an embodiment of the present invention includes reacting a compound represented by Formula 1a with a compound represented by Formula 1b to produce a compound represented by Formula 1c, and reacting the compound represented by formula 1c with compounds represented by Formula 1d to produce the aminostyryl compound represented by Formula 1:

Formula 1a

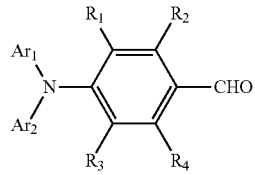

Formula 1b

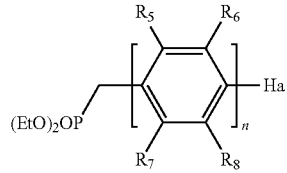

Formula 1c

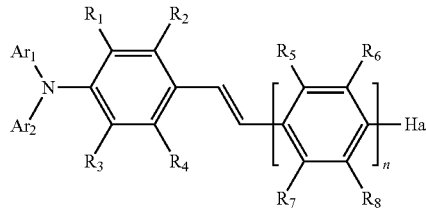

Formula 1d

L—Q.

In Formulae 1a through 1c, $Ar_1$, $Ar_2$, $R_1$, $R_2$, $R_3$, $R_4$, $R_5$, $R_6$, $R_7$, $R_8$ and n have already been described.

In Formulae 1b and 1c, Ha is a halogen, such as F, Cl, Br and I, and preferably, Br.

In Formula 1d, L has already been described, and Q is a B-containing group. Examples of the B-containing group include

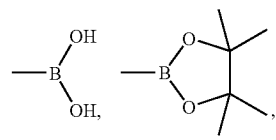

and the like, but the B-containing group is not limited to these compounds.

Reaction Scheme 1 below illustrates a detailed mechanism for synthesizing the aminostyryl compound according to an embodiment of the present invention:

Reaction Scheme 1

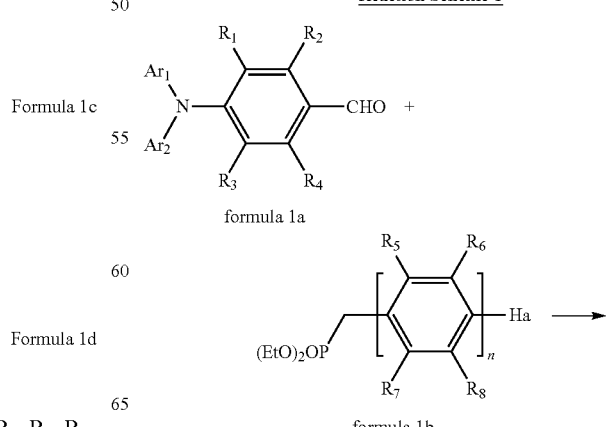

formula 1a formula 1b

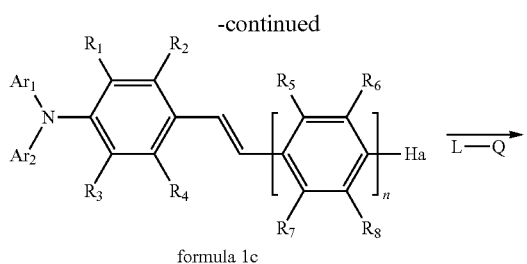

formula 1c

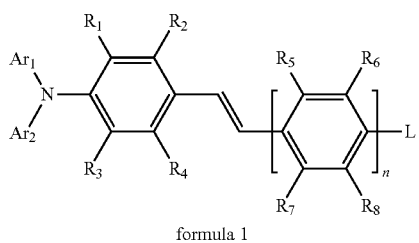

formula 1

First, the compound represented by Formula 1a is reacted with the compound represented by Formula 1b to produce a compound represented by Formula 1c. The compound represented by Formula 1a is commercially available, or, alternatively, can be obtained by reacting triarylamine with $POCl_3$ (for example, by reacting triphenylamine with $POCl_3$.) The compound represented by Formula 1b can be obtained by reacting an aryl compound substituted with methyl halide with triethyl phosphite($P(OEt)_3$) (for example, by reacting bromobenzylbromide with triethyl phosphite.) However, methods of preparing the compounds 1a and 1b are not limited to the above. Subsequently, the compound represented by Formula 1b is reacted with compounds represented by Formula 1d to produce the compound represented by Formula 1. This reaction can be performed, for example, in the presence of $K_2CO_3$ and $Pd(PPh_3)_4$ (palladium tetrakistriphenylphosphine). The compounds represented by Formulae 1d can be boronic acids or dioxaborolanes having an L group, but are not limited thereto. The structures of all of the resulting compounds can be identified using 1H NMR and Mass Spectrometer.

The aminostyryl compound according to an embodiment of the present invention described above can be used in an organic light emitting device. An organic light emitting device according to an embodiment of the present invention includes a first electrode, a second electrode, and at least an organic layer interposed between the first electrode and the second electrode. The organic layer can be formed of the aminostyryl compound represented by Formula 1 described above. In detail, the organic layer can be an emissive layer or a hole transport layer. The structure of the organic layer may vary. In other words, at least one layer selected from the group consisting of a hole injection layer, a hole transport layer, an electron blocking layer, a hole blocking layer, an electron transport layer, and an electron injection layer can be formed between the first electrode and the second electrode.

In detail, organic light emitting devices according to embodiments of the present invention are schematically illustrated in FIGS. 1A, 1B, and 1C. Referring to FIG. 1A, the organic light emitting device has a structure of first electrode/hole injection layer/emissive layer/electron transport layer/electron injection layer/second electrode. Referring to FIG. 1B, the organic light emitting device has a structure of first electrode/hole injection layer/hole transport layer/emissive layer/electron transport layer/electron injection layer/second electrode. Referring to FIG. 1C, the organic light emitting device has a structure of first electrode/hole injection layer/hole transport layer/emissive layer/hole blocking layer/electron transport layer/electron injection layer/second electrode. The emissive layer may include the compound represented by Formula 1.

The emissive layer of the organic light emitting device according to an embodiment of the present invention may include at least one dopant selected from the group consisting of red, green, blue and white phosphorescent dopants and red, green, blue, and white fluorescent dopants. The phosphorescent dopant can be an organic metal compound which contains at least one atom selected from the group consisting of Ir, Pt, Os, Ti, Zr, Hf, Eu, Tb, and Tm.

Hereinafter, a method of manufacturing an organic light emitting device according to an embodiment of the present invention will be described with reference to the organic light emitting device illustrated in FIG. 1C.

First, a first electrode is formed by depositing or sputtering a high work-function material that is used to form the first electrode, on a substrate. The first electrode can be an anode. The substrate, which can be any substrate that is used in conventional organic light emitting devices, may be a glass substrate or a transparent plastic substrate with excellent mechanical strength, thermal stability, transparency, surface smoothness, ease of treatment, and that is waterproof. The material that is used to form the first electrode can be ITO, IZO, $SnO_2$, ZnO, or any transparent material which has high conductivity.

Then, a hole injection layer (HIL) can be formed on the first electrode by vacuum deposition, spin coating, casting, langmuir blodgett (LB), or the like.

When the HIL is formed by vacuum deposition, vacuum conditions may vary according to a compound that is used to form the HIL, and the structure and thermal properties of the HIL to be formed. In general, however, conditions for vacuum deposition may include a deposition temperature of 100° C.-500° C., a pressure of $10^{-8}$ torr $-10^{-3}$ torr, a deposition speed of 0.01-100 Å/sec, and a layer thickness of 10 Å-5 μm.

When the HIL is formed by spin coating, coating conditions may vary according to a compound that is used to form the HIL, and the structure and thermal properties of the HIL to be formed. In general, the coating speed may be in the range of about 2,000 rpm to 5,000 rpm, and a temperature for heat treatment, which is performed to remove a solvent after coating may be in the range of about 80° C. to 200° C.

A material that is used to form the HIL is not limited, and may be a phthalocyanine compound, such as a copperphthalocyanine disclosed in U.S. Pat. No. 4,356,429; a star-burst type amine derivative, such as TCTA, m-MTDATA, and m-MTDAPB, disclosed in Advanced Material, 6, p. 677 (1994); polyaniline/Dodecylbenzenesulfonic acid (Pani/DBSA); poly(3,4-ethylenedioxythiophene)/Poly(4-styrenesulfonate (PEDOT/PSS): polyaniline/camphor sulfonic acid (Pani/CSA); (polyaniline)/poly(4-styrenesulfonate) (PANI/PSS); or the like, which is a soluble and conductive polymer.

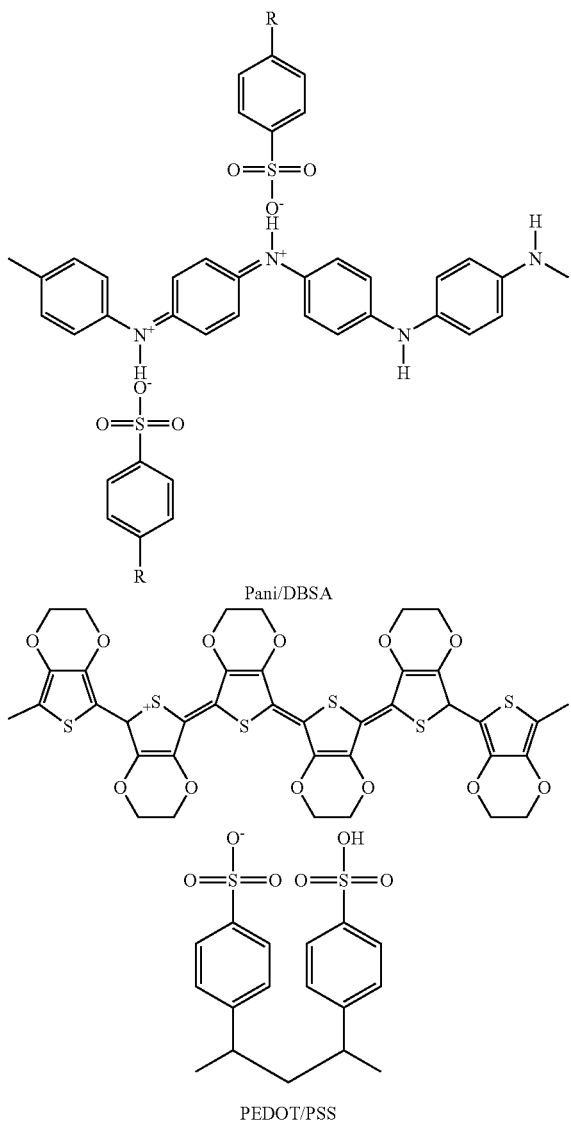

Pani/DBSA

PEDOT/PSS

The thickness of the HIL may be in the range of about 100 Å to 10,000 Å, and preferably, in the range of 100 Å to 1,000 Å. When the thickness of the HIL is less than 100 Å, hole injecting capability may be reduced on the other hand, when the thickness of the HIL is greater than 10,000 Å, a driving voltage of the device can be increased.

Then, a hole transport layer (HTL) can be formed on the HIL using a vacuum deposition method, a spin coating method, a casting method, LB, or the like. When the HTL is formed by vacuum deposition and spin coating, conditions for deposition and coating are similar to those for formation of the HIL, although conditions for deposition and coating may vary according to a material that is used to form the HTL.

The material that is used to form the HTL is not limited, and can be any material that is conventionally used to form the HTL. For example, the material that is used to form the HTL can be a carbazole derivative, such as N-phenylcarbazole, polyvinylcarbazole; a typical amine derivative having an aromatic condensation ring, such as N,N'-bis(3-methylphenyl)-N,N'-diphenyl-[1,1-biphenyl]-4,4'-diamine(TPD), N,N'-di(naphthalene-1-yl)-N,N'-diphenyl benzydine (α-NPD); or the like. Alternatively, the material that is used to form the HTL can be the compound represented by Formula 1.

The thickness of the HTL may be in the range of about 50 Å to about 1,000 Å, and preferably, 100 Å to about 600 Å. When the thickness of the HTL is less than 50 Å, hole transporting capability may be reduced. On the other hand, when the thickness of the HTL is greater than 1,000 Å, the driving voltage of the device may increase.

Then, an emissive layer (EML) can be formed on the HTL by vacuum deposition, spin coating, casting, LB, or the like. When the EML is formed by vacuum deposition or spin coating, conditions for deposition and coating are similar to those for formation of the HIL, although conditions for deposition and coating may vary according to a material that is used to form the EML.

The EML may be formed of the aminostyryl compound represented by Formula 1 according to an embodiment of the present invention. In this case, a proper host material that is known in the art can be used together with the aminostyryl compound represented by Formula 1. The host material may be, for example, Alq$_3$, CBP(4,4'-N,N'-dicarbazole-biphenyl), or PVK(poly(n-binylcarbazole)).

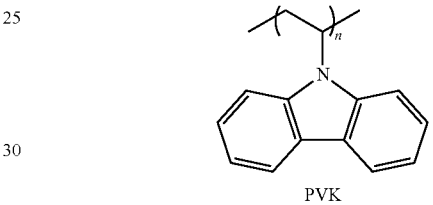

PVK

The material that is used to form the EML can be any dopant that is known in the art, in addition to the aminostyryl compound according to an embodiment of the present invention. Examples of a fluorescent dopant include IDE102 and IDE105 obtained from Idemitsu Kosan Co., Ltd., C545T obtained from Hiyashibara Co., and the like. Examples of a phosphorescent dopant include a red phosphorescent dopant PtOEP, RD 61 obtained from UDC Co., a green phosphorescent dopant Ir(PPy)$_3$ (PPy=2-phenylpyridine), a blue phosphorescent dopant F2Irpic, and the like.

The concentration of the dopant is not limited, but conventionally in the range of 0.01 to 15 parts by weight based on 100 parts by weight of a host.

The thickness of the EML may be in the range of about 100 Å to 1,000 Å, and preferably, in the range of 200 Å to 600 Å. When the thickness of the EML is less than 100 Å, emissive capability may be reduced. On the other hand, when the thickness of the EML is greater than 1,000 Å, the driving voltage of the device may increase.

A hole blocking layer (HBL) can be formed on the EML using a vacuum deposition method, a spin coating method, a casting method, LB, or the like, to prevent diffusion of triplet excitons or holes into an electron transport layer when the phosphorescent dopant is used to form the EML. When the HBL is formed by vacuum deposition or spin coating, conditions for deposition and coating are similar to those for formation of the HIL, although conditions for deposition and coating conditions may vary according to a material that is used to form the HBL. The material that is used to form the HBL may be, for example, an oxadiazole derivative, a triazole derivative, a phenanthroline derivative, or a hole blocking material disclosed in JP No. 11-329734(A1) which is incorporated herein by reference, or 2,9-dimethyl-4,7-diphenyl-1,10-phenanthroline (BCP).

The thickness of the HBL may be in the range of about 50 Å to 1,000 Å, and preferably, in the range of 100 Å to 300 Å. When the thickness of the HBL is less than 50 Å, hole blocking capability may be reduced. On the other hand, when the thickness of the HBL is greater than 1,000 Å, the driving voltage of the device may increase.

Then, an electron transport layer (ETL) is formed by vacuum deposition, spin coating, casting, or the like. When the ETL is formed by vacuum deposition and spin coating, conditions for deposition and coating are, in general, similar to those for formation of the HIL, although conditions for deposition and coating conditions may vary according to a material that is used to form the ETL. The material that is used to form the ETL may be a quinoline derivative which stably transports injected electrons from cathode, in particular, tris(8-quinolinorate)aluminum ($Alq_3$), TAZ, or the like which is known in the art.

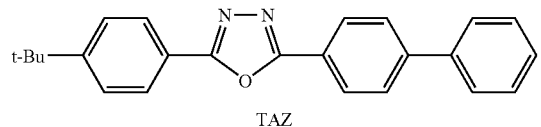

TAZ

The thickness of the ETL may be in the range of about 100 Å to 1,000 Å, and preferably, 200 Å to 500 Å. When the thickness of the ETL is less than 100 Å, electron transporting capability may be reduced. On the other hand, when the thickness of the ETL is greater than 1,000 Å, the driving voltage of the device may increase.

Then, an electron injection layer (EIL), which is formed of a material allowing easy injection of electrons from a cathode, can be formed on the ETL. The material that is used to form the EIL is not limited.

The material that is used to form the EIL may be LiF, NaCl, CsF, $Li_2O$, BaO, or the like which is known in the art. Conditions for depositing the EIL are, in general, similar to conditions for formation of the HIL, although they may vary according to the material that is used to form the EIL.

The thickness of the EIL may be in the range of about 1 Å to 100 Å, and preferably, 5 Å to 50 Å. When the thickness of the EIL is less than 1 Å, electron injecting capability may be reduced. On the other hand, when the thickness of the EIL is greater than 100 Å, the driving voltage of the device may increase.

Finally, a second electrode can be formed on the EIL by vacuum deposition, sputtering, or the like. The second electrode can be used as a cathode. A metal that is used to form the second electrode may be a low work-function metal, an alloy, an electrically conductive compound, or a combination of these. In detail, the metal that is sued to form the second electrode may be Li, Mg, Al, Al—Li, Ca, Mg—In, Mg—Ag, or the like. In addition, a transparent cathode formed of ITO or IZO can be used to produce a front surface light emitting device.

The organic light emitting device according to an embodiment of the present invention may have the structure of first electrode/HIL/HTL/EML/HBL/ETL/EIL/second electrode illustrated in FIG. 1C. However, the structure of the organic light emitting device according to an embodiment of the present invention may vary (for example, the organic light emitting device illustrated in FIG. 1A which will be described in greater detail in Examples below.)

Hereinafter, Synthesis Examples and Examples of Compounds 2 through 10 respectively represented by Formulae 2 through 10 according to an embodiment of the present invention (hereinafter, respectively referred to as "Compound 2" through "Compound 10") will be described in detail. However, Synthesis Examples and Examples do not limit the scope of the present invention.

EXAMPLES

Comparative Synthesis Example 1

1 g (4.39 mmol) of benzylphosphonic acid diethylester was dissolved in a solvent of 100 ml of tetrahydrofurane, and 0.157 g (6.57 mmol) of sodium hydride was added thereto and reacted at 50° C. for 1 hour. 1 g (3.66 mmol) of 4-(N,N-diphenylamino)benzaldehyde was dropped to the reaction mixture and reacted at 70° C. for one day. 20 ml of ethanol was added to the result and dried in a vacuum condition. 200 ml of methylenechloride was added to the dried result. An organic layer collected from the result was washed twice using 50 ml of water and dried over anhydrous magnesium sulfate to dry the solvent only. The dried result was purified using a silica gel column chromatography to produce a Comparative Compound A represented by Formula A with a yield of 78%.

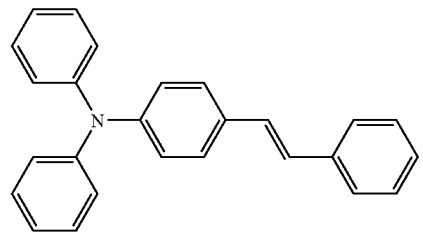

Formula A

Synthesis Example 2

Compound 2 was synthesized through Reaction Scheme 2:

Reaction Scheme 2

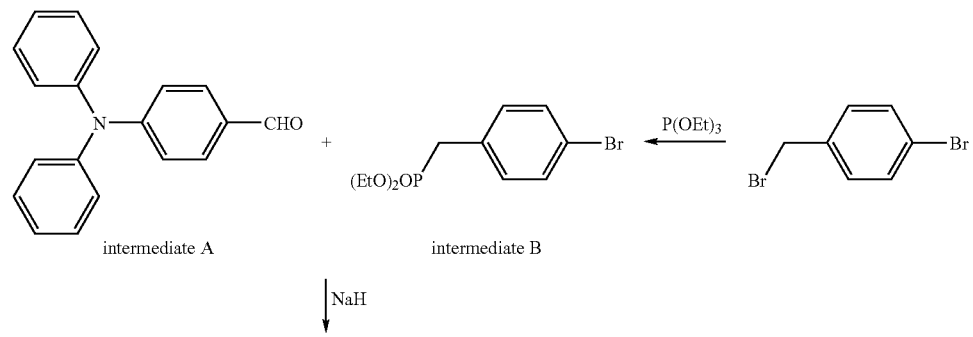

intermediate A        intermediate B

↓ NaH

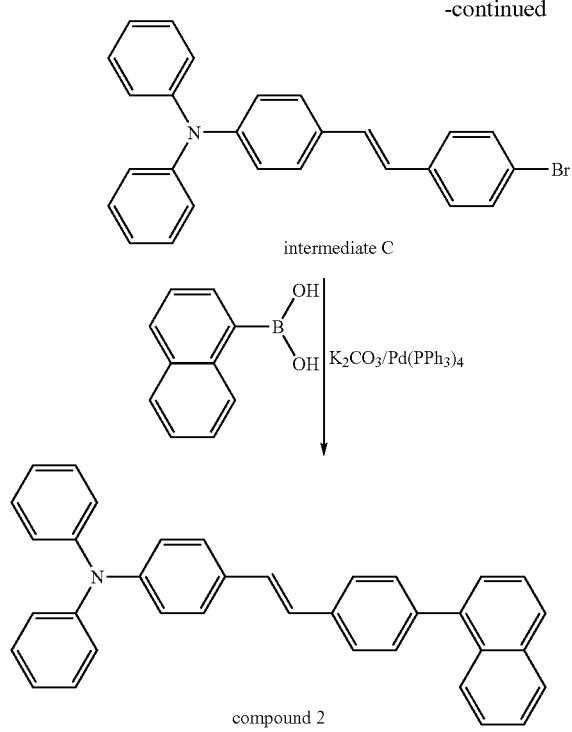

intermediate C compound 2

Synthesis of Intermediate B 3 g (12 mmol) of 4-bromobenzyl bromide was mixed with 4.5 g (18 mmol) of P(OCH$_2$CH$_3$)$_3$ and stirred at 185° C. for 6 hours. The result was cooled to room temperature to produce a crude product, which was purified using a silica gel column chromatography to produce 3.13 g (Yield 85%.) of Intermediate B

Synthesis of Intermediate C

Intermediate C (Yield 75%) was synthesized and purified in the same manner as in Comparative Example 1 except that Intermediate B was used instead of benzylphosphonic acid diethylester.

Synthesis of Compound 2

1 g (2.35 mmol) of Intermediate C, 0.48 g (2.81 mmol) of 1-naphthaleneboronic acid, 0.135 g (0.12 mmol) of tetrakis (triphenylphosphine)paladium, 0.49 g (3.53 mmol) of K$_2$CO$_3$ were dissolved in 100 ml of toluene and 10 ml of water and stirred at a refluxing temperature for 48 hours. The reaction mixture was cooled to room temperature, and 100 ml of diethylether was added thereto. The mixture was washed twice using 50 ml of water. An organic layer was collected from the washed result, and dried over anhydrous magnesium sulfate to evaporate the solvent. As a result, a crude product was obtained. The crude product was purified using a silicagel column chromatography to produce 0.7 g of Compound 2 (Yield 63%).

Synthesis Example 3

Compound 3 was synthesized through Reaction Scheme 3 below:

Reaction Scheme 3

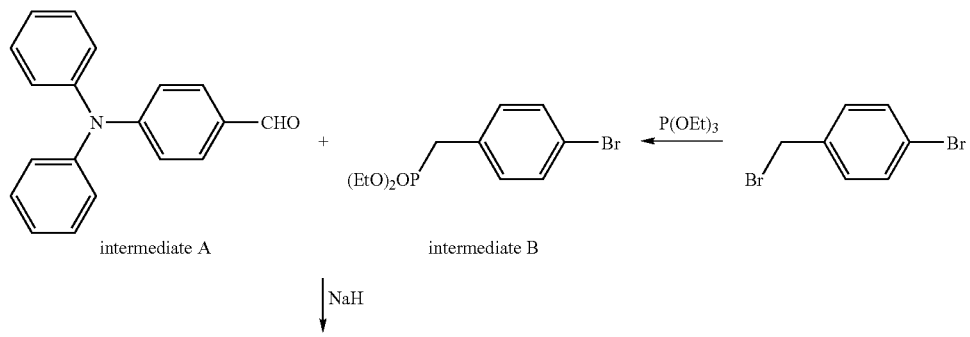

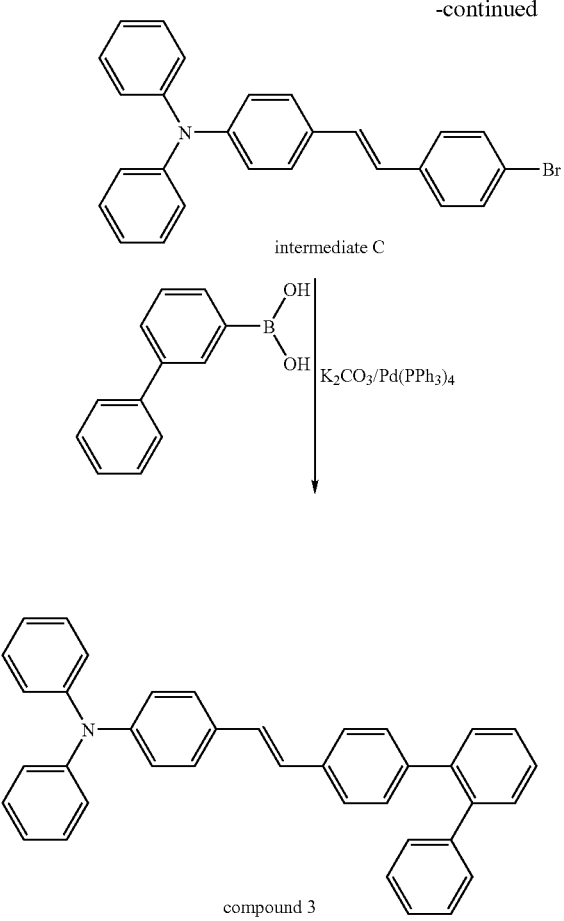
intermediate C
compound 3
Compound 3 was produced in the same manner as in Synthesis Example 2, except that 4-biphenylyl boronic acid was used instead of 1-naphthalene boronic acid in the synthesis of Compound 2 of the Synthesis Example 2.
Synthesis Example 4
Compound 4 was synthesized through Reaction Scheme 4:
Reaction Scheme 4
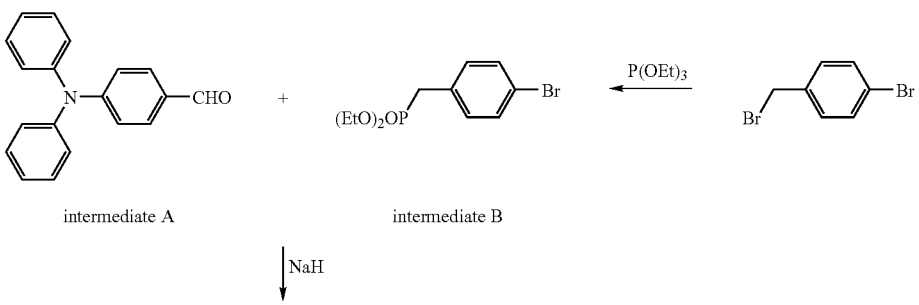
intermediate A          intermediate B -continued

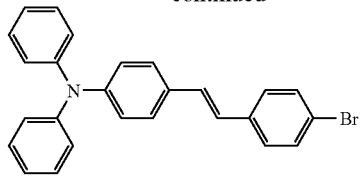

intermediate C

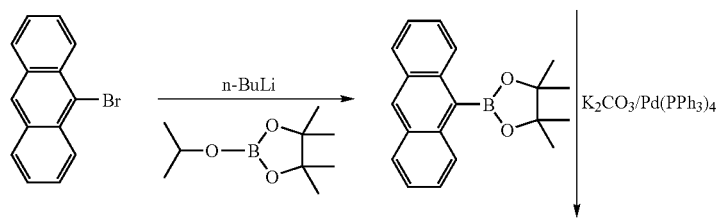

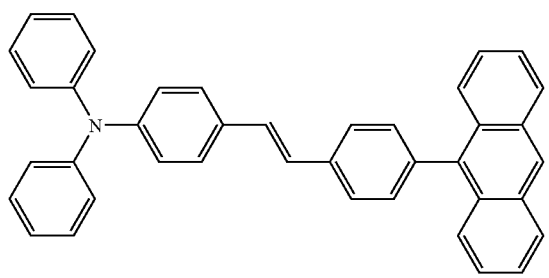

compound 4

Compound 4 was produced in the same manner as in Synthesis Example 2, except that Intermediate D was used instead of 1-naphthlene boronic acid. Intermediate D was synthesized thorough Reaction Scheme 4' below:

Reaction Scheme 4'

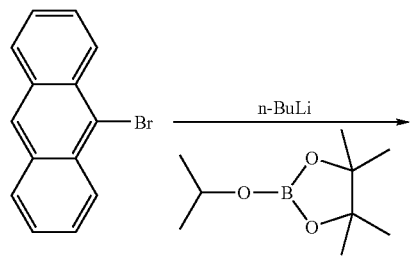

-continued

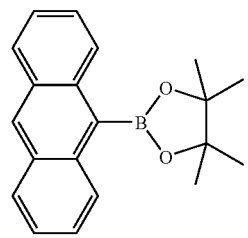

intermediate D 5.35 ml (8.56 mmol) of 1.6M n-butyllithium was slowly dropped to 2 g (7.78 mmol) of 9-bromoanthracene dissolved in a solvent of 100 ml of tetrahydrofurane and reacted at −78° C. for one hour. 1.74 g (9.33 mmol) of 2-isopropoxy-4,4,5,5-tetramethyl-1,3,2-dioxaborolane was added to the reaction mixture, stirred at room temperature for 18 hours, and 100 ml of methylenechloride was added thereto. The result was washed twice using 50 ml of water. Then, an organic layer was collected from the washed result and dried over anhydrous magnesiumsulfate to evaporate the solvent. As a result, a crude product was obtained. The crude product was purified using a silicagel column chromatography to produce 1.68 g (Yield 71%) of Intermediate D.

Synthesis Example 5
Compound 5 was synthesized through Reaction Scheme 5:
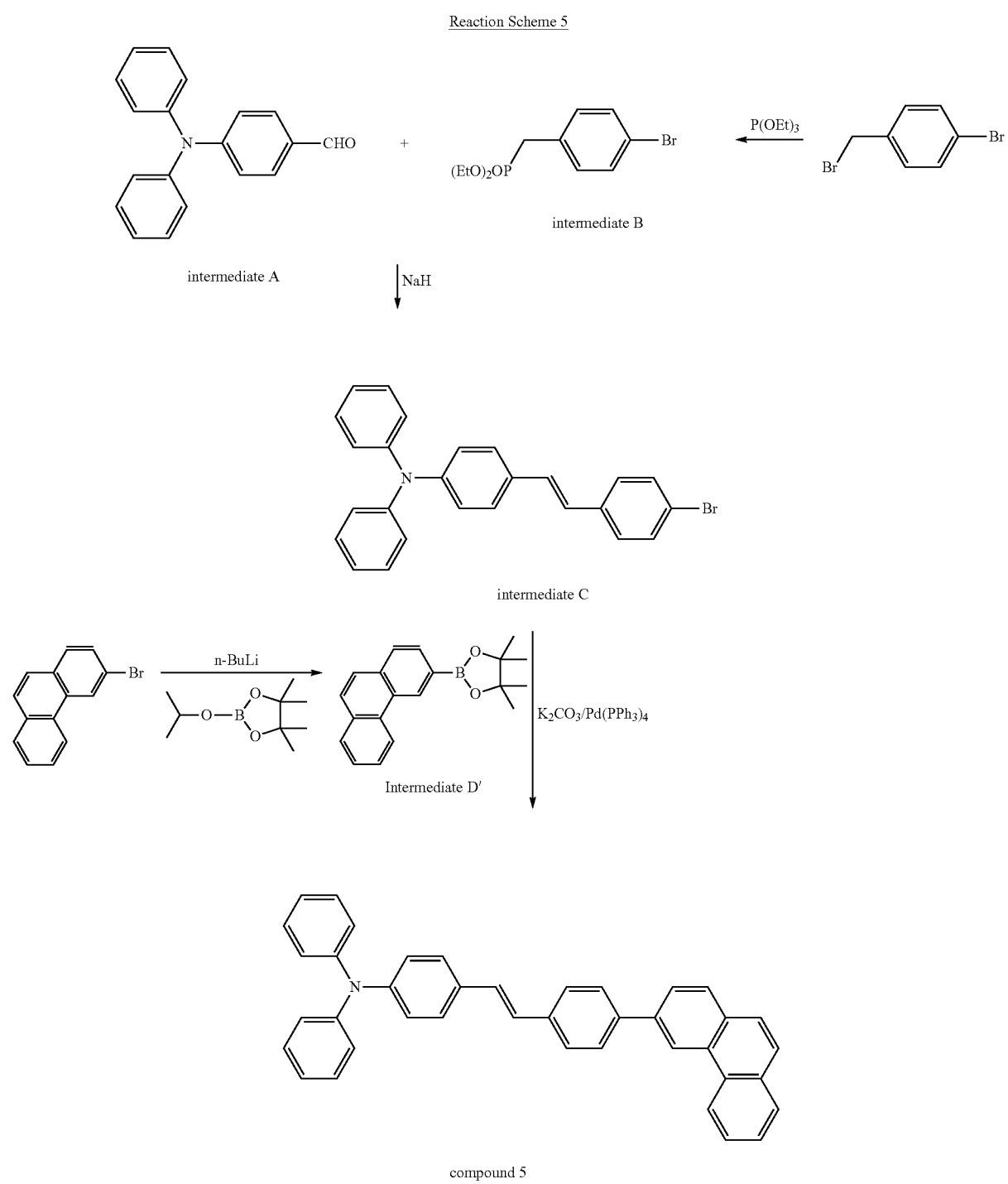
Compound 5 was produced in the same manner as in Synthesis Example 4, except that phenanthrene was used as a starting material instead of anthracene in the Reaction Scheme 4'.

Synthesis Example 6

Compound 6 was produced through Reaction Scheme 6:

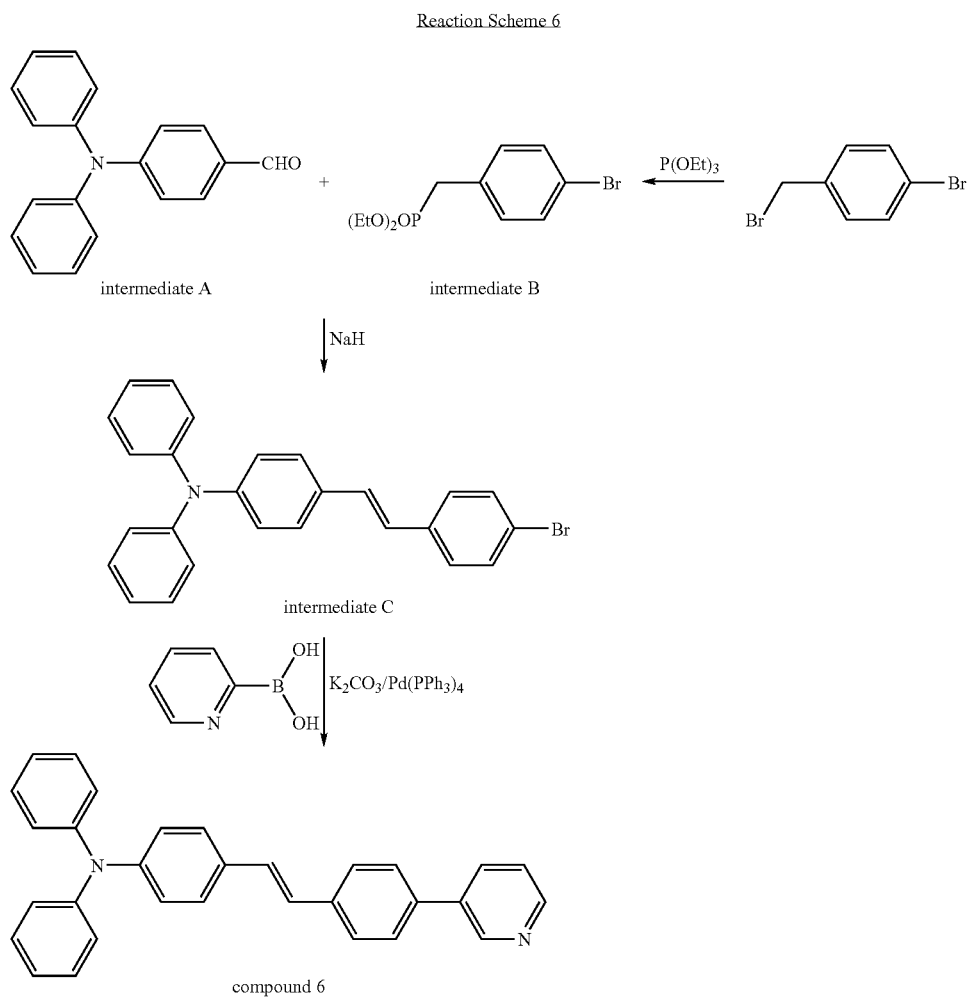

Reaction Scheme 6

Compound 6 was produced in the same manner as in Synthesis Example 2 for Compound 2 except that pyridinyl boronic acid was used instead of 1-naphthalene boronic acid in the synthesis of Compound 2 of the Synthesis Example 2.

Synthesis Example 7

Compound 7 was produced through Reaction Scheme 7 below:

Reaction Scheme 7

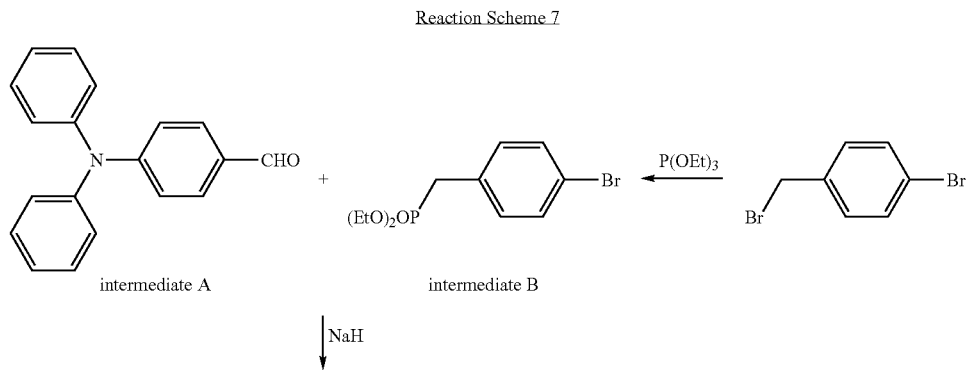

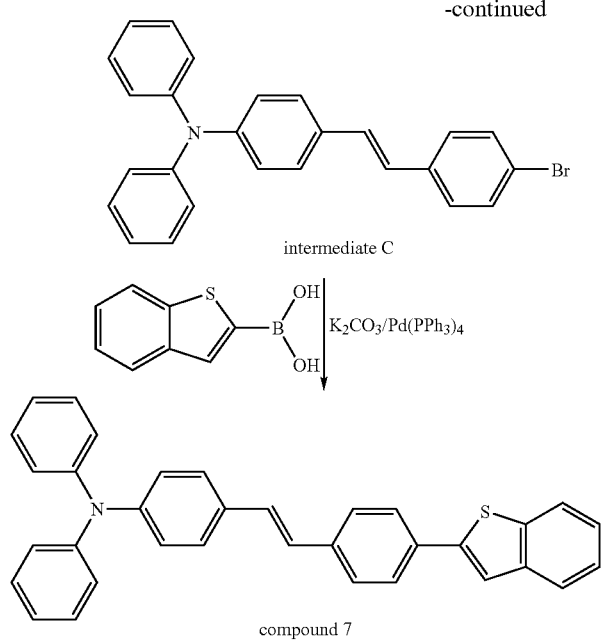
intermediate C
compound 7
Compound 7 was produced in the same manner as in Synthesis Example 2 for Compound 2 except that benzothiophenyl boronic acid was used instead of 1-naphthalene boronic acid in the synthesis of Compound 2 of the Synthesis Example 2.
Synthesis Example 8
Compound 8 was synthesized through Reaction Scheme 8 below:
Reaction Scheme 8
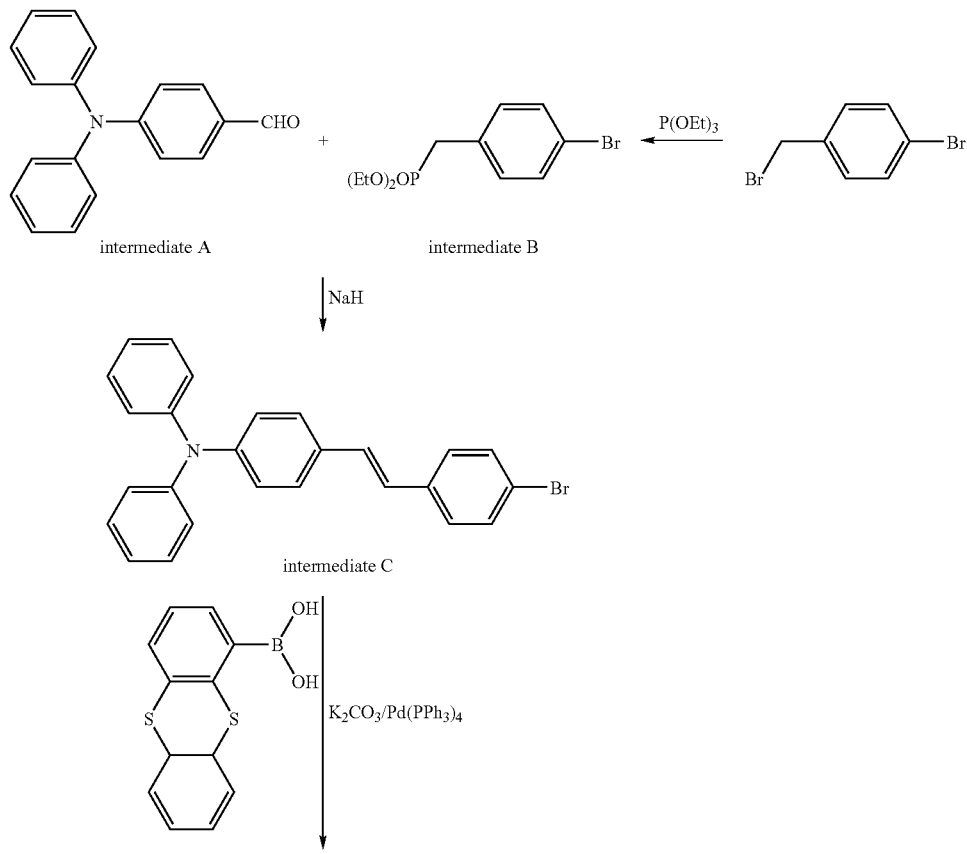

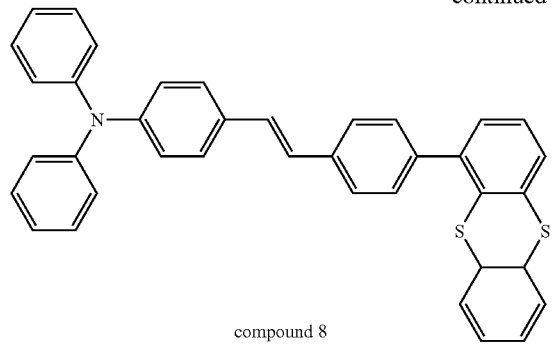
compound 8
Compound 8 was produced in the same manner as in Synthesis Example 2 for Compound 2 except that thianthrenyl boronic acid was used instead of 1-naphthalene boronic acid in the synthesis of Compound 2 of the Synthesis Example 2.
Synthesis Example 9
Compound 9 was synthesized through Reaction Scheme 9 below:
Reaction Scheme 9
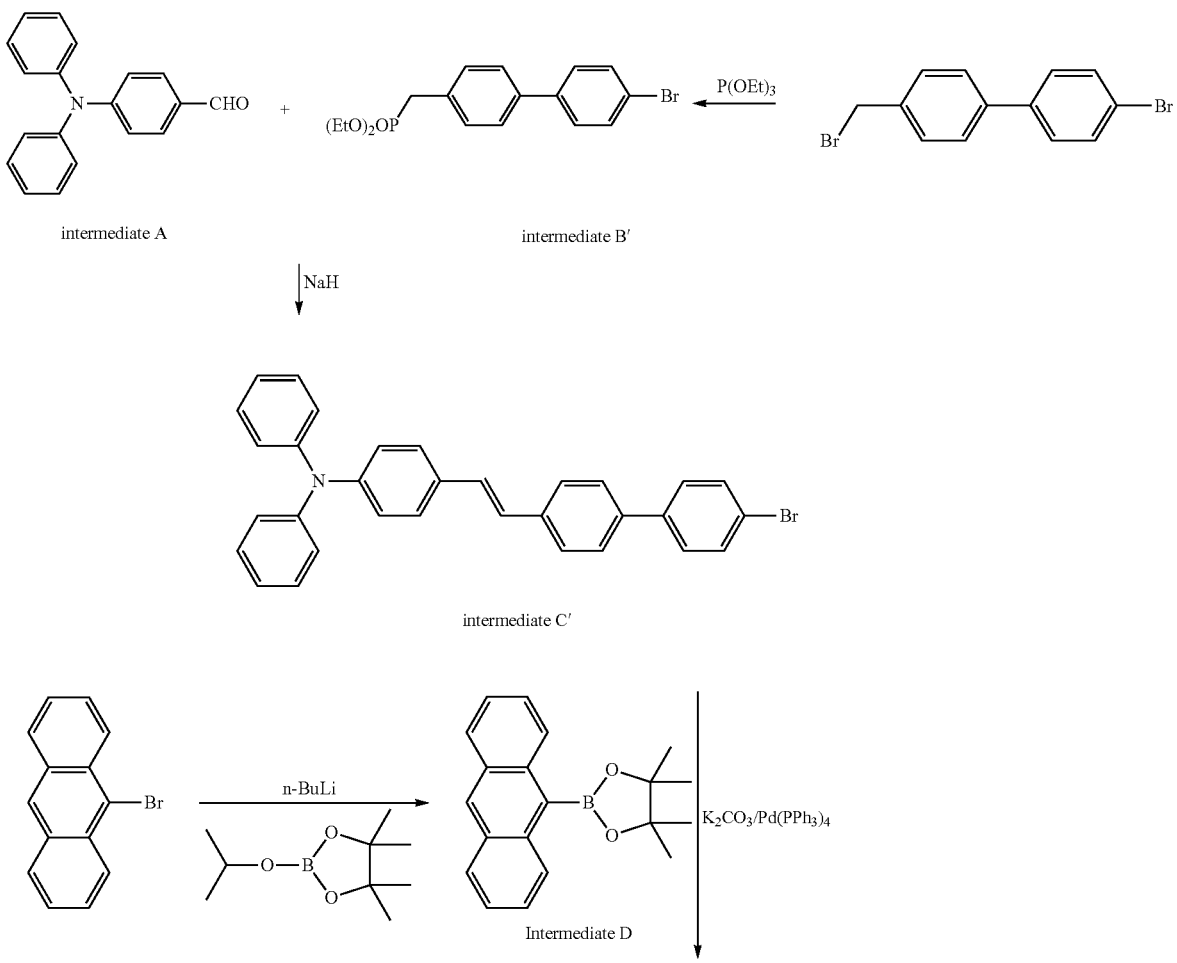

-continued
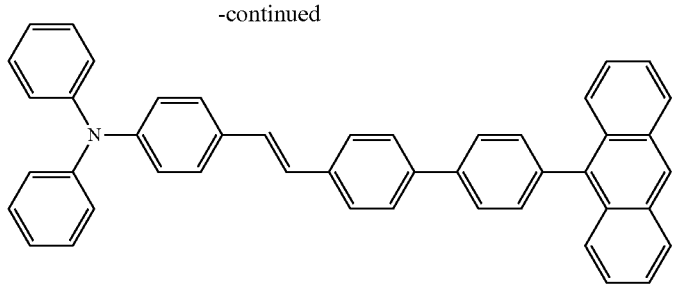
compound 9
Compound 9 was produced in the same manner as in Synthesis Example 4 except that Intermediate B' was used instead of Intermediate B.
Synthesis Example 10
Compound 10 was synthesized through Reaction Scheme 10 below:
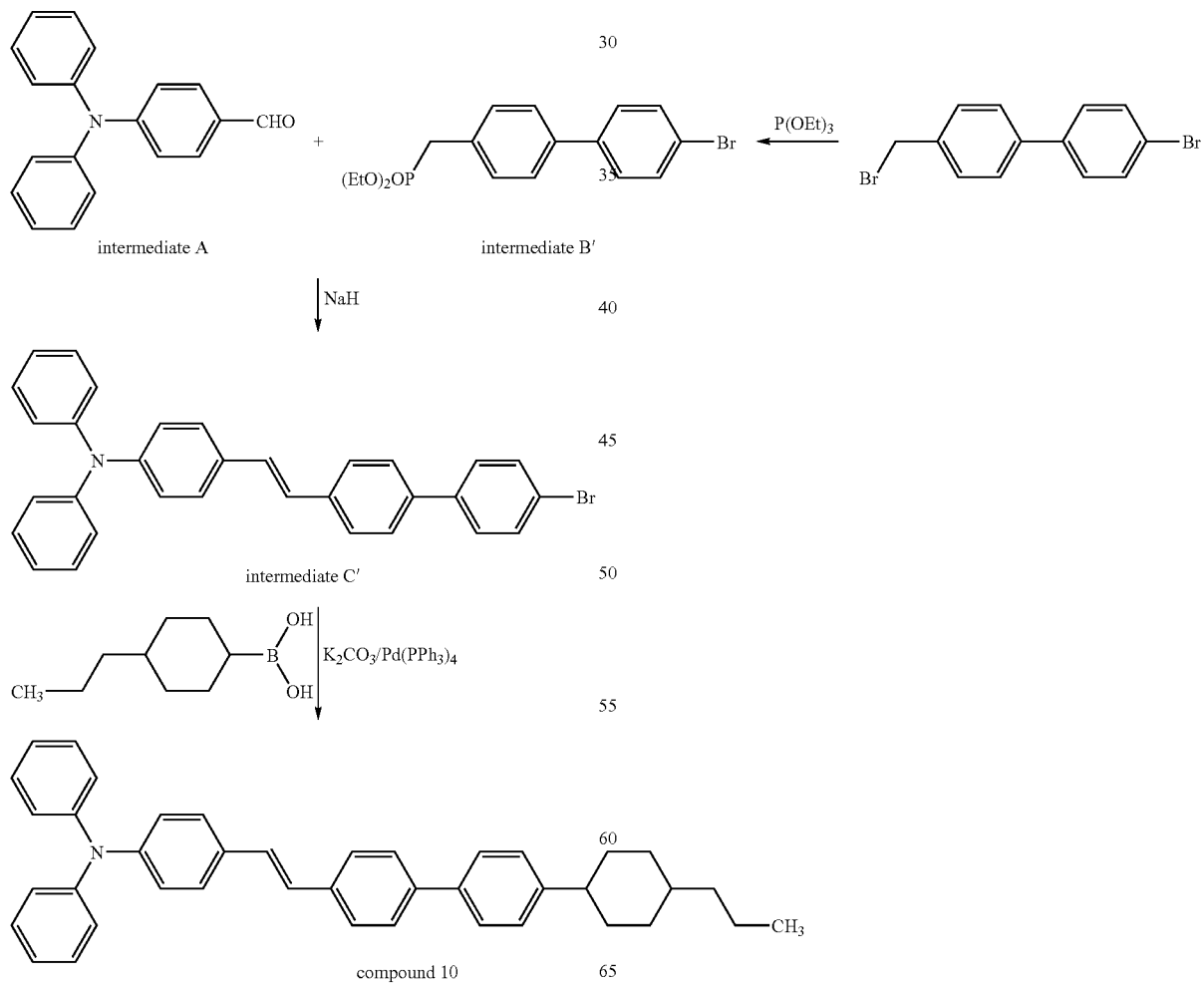

Compound 10 was produced in the same manner as in Synthesis Example 2 for Compound 2 except that propyl (cyclohexyl) boronic acid was used instead of 1-naphthalene boronic acid in the synthesis of Compound 2 of the Synthesis Example 2.

Measurement Example 1

Thermal Stability Tests for Compounds 2 Through 10

Thermal stability tests for Compounds 2 through 10 were carried out by measuring a glass transition temperature (Tg) and a melting point (Tm) of respective compounds. Tg and Tm were measured by performing thermal analysis using thermo gravimetric analysis (TGA) and differential scanning calorimetry (DSC) under the following conditions: $N_2$ atmosphere, temperatures of room temperature to 600° C. (10° C./min)-TGA and of room temperature to 400° C.-DSC, and Pan Type: Pt Pan in disposable Al Pan (TGA) and disposable Al pan (DSC). The results are shown in Table 1 below:

TABLE 1

| Compound No. | Tg (° C.) | Tm (° C.) |
|---|---|---|
| 2 | 65 | 201 |
| 3 | 60 | 196 |
| 4 | 87 | 233 |
| 5 | 89 | 237 |
| 6 | 65 | 215 |
| 7 | 67 | 217 |
| 8 | 67 | 211 |
| 9 | 87 | 238 |
| 10 | 65 | 203 |

Therefore, it was confirmed that Compounds 2 through 10 have thermal stability properties suitable for an organic light emitting device.

Measurement Example 2

Luminance Tests for Comparative Compound A and Compounds 2 Through 10

Luminous properties of Comparative Compound A and Compounds 2 through 10 were measured using absorption spectra and photoluminescence (PL) spectra. First, the absorption spectrum of 0.2 mM Compound 2 diluted in toluene was obtained using Shimadzu UV-350 Spectrometer. This process was performed on Compounds 3 through 10 and Comparative Compound A, respectively. Meanwhile, the PL spectrum of 10 mM Compound 2 diluted in toluene was obtained using an ISC PC1 spectrofluorometer having a Xenon lamp. This process was performed on Compounds 3 through 10 and Comparative Compound A, respectively. The results are shown in Table 2:

TABLE 2

| Compound No. | Maximum absorption wavelength (nm) | Maximum PL wavelength (nm) |
|---|---|---|
| A (Comparative Example) | 367 | 418 |
| 2 | 378 | 428 |
| 3 | 380 | 426 |
| 4 | 371 | 421 |

TABLE 2-continued

| Compound No. | Maximum absorption wavelength (nm) | Maximum PL wavelength (nm) |
|---|---|---|
| 5 | 371 | 425 |
| 6 | 380 | 437 |
| 7 | 380 | 441 |
| 8 | 381 | 442 |
| 9 | 371 | 423 |
| 10 | 380 | 430 |

Measurement Example 3

Luminance Tests for Comparative Compound A and Compounds 2 Through 10 (When Mixed with a Host to Form a Film)

Comparative Compound A and Compounds 2 through 10 were respectively mixed with PVK to form films, and the absorption spectra, PL spectra, and quantum yields of these films were measured.

First, a quartz substrate was washed using chloroform and pure water. Separately, 0.1 g of PVK (obtained from Aldrich Co.) was mixed with 0.01 g of Compound 2 (10 parts by weight of Compound 2 based on 100 parts by weight of PVK) dissolved in toluene. The resulting mixture was spin coated on the quartz substrate and heat treated at 110° C. for 2 hours to form a compound 2_PVK film with 1,000 Å thickness. The absorption spectrum, PL spectrum, and quantum yield of the compound 2_PVK film were measured. This process was performed on Compounds 3 through 10 and Comparative Compound A, respectively, and the results are shown in Table 3:

TABLE 3

| Film No. | Maximum Absorption Wavelength (nm) | Maximum PL Wavelength (nm) | Quantum Yield (%) |
|---|---|---|---|
| Compound A(Comparative Example)_PVK | 368 | 461 | 35 |
| Compound 2_PVK | 381 | 470 | 81 |
| Compound 3_PVK | 384 | 454 | 74 |
| Compound 4_PVK | 372 | 447 | 85 |
| Compound 5_PVK | 372 | 451 | 76 |
| Compound 6_PVK | 381 | 461 | 67 |
| Compound 7_PVK | 381 | 467 | 68 |
| Compound 8_PVK | 383 | 467 | 65 |
| Compound 9_PVK | 381 | 446 | 84 |
| Compound 10_PVK | 381 | 448 | 77 |

Therefore, it was confirmed that films formed of respective Compounds 2 through 10 according to an embodiment of the present invention and PVK had better absorption spectrum, and quantum yield suitable for an organic light emitting device than Comparative Compound A.

Comparative Example 1

An organic light emitting device having the following structure was manufactured using Comparative Compound A as a dopant of an EML: ITO/PEDOT(500 Å)/Comparative compound A_PVK(480 Å)/TAZ(200 Å)/LiF(10 Å)/Al(2,000 Å).

A 15 Ω/cm² (1200 Å) ITO glass substrate, which was obtained from Corning Co., was cut to a size of 50 mm×50 mm×0.7 mm, microwave washed with isopropyl alcohol for 5 minutes, microwave washed with pure water for 5 minutes, and washed with UV ozone for 30 minutes. PEDOT-PSS (AI4083) obtained from Bayer Co. was coated on the substrate and heat treated at 120° C. for 5 hours to form a HIL with a thickness of 500 Å. A mixture of 0.1 g of PVK and 0.01 g of Comparative Compound A (10 parts by weight of Comparative Compound A based on 100 parts by weight of PVK) was spin coated on the HIL and heat treated at 110° C. for 2 hours to form an EML with a thickness of 480 Å. Then, a TAZ compound was spin coated on the EML and heat treated at 110° C. for 2 hours to form an ETL with a thickness of 200 Å. LiF was vacuum deposited on the ETL to form an EIL with a thickness of 10 Å, and then Al was vacuum deposited on the EIL to form a cathode with a thickness of 2,000 Å. As a result, an organic light emitting device illustrated in FIG. 1A was manufactured. The organic light emitting device will be referred to as Comparative Sample A.

Examples 2 through 10

Organic light emitting devices were manufactured in the same manner as in Comparative Example 1 except that Compounds 2 through 10 synthesized in Synthesis Examples 2 through 10 were used instead of Comparative Compound A to form the EML. These organic light emitting devices will be referred to as Samples 2 through 10, respectively.

Measurement Example 4

Characteristics of Comparative Sample A and Samples 2 Through 10

Driving voltages, color purities, efficiencies, and external quantum yields of Comparative Sample A and Samples 2 through 10 were measured using PR650 (Spectroscan) Source Measurement Unit.

TABLE 4

| Sample No. | Driving Voltage(V) | CIE Color Coordinate (~100 cd/m²) | Efficiency at 7.2 V(cd/A) | External Quantum Yield (%) |
|---|---|---|---|---|
| A(Comparative Example) | 7.1 | (0.16, 0.14) | 0.71 | ~0.7 |
| 2 | 4.2 | (0.16, 0.13) | 1.77 | ~1.7 |
| 3 | 4.2 | (0.16, 0.12) | 1.45 | ~1.5 |
| 4 | 4.1 | (0.15, 0.11) | 1.74 | ~1.7 |
| 5 | 4.1 | (0.15, 0.13) | 1.58 | ~1.5 |
| 6 | 5.4 | (0.16, 0.15) | 1.23 | ~1.3 |
| 7 | 5.3 | (0.16, 0.16) | 1.21 | ~1.3 |
| 8 | 5.4 | (0.16, 0.14) | 1.24 | ~1.4 |
| 9 | 3.8 | (0.15, 0.11) | 1.77 | ~1.7 |
| 10 | 4.6 | (0.16, 0.11) | 1.29 | ~1.4 |

As shown in Table 4, Samples 2 through 10 according to an embodiment of the present invention had better characteristics than the conventional Comparative Sample A.

An aminostyryl compound represented by Formula 1 according to the present invention has excellent luminous characteristics and thermal stability. Accordingly, an organic light emitting device using the aminostyryl compound according to the present invention exhibits low driving voltage, excellent color purity, high efficiency, high external quantum yield, and high brightness.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:
1. An aminostyryl compound represented by Formula 1:

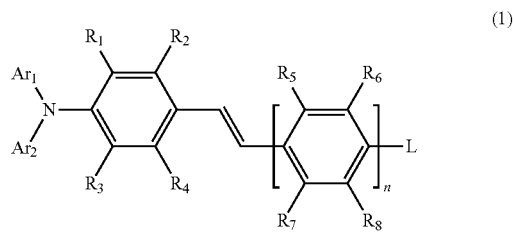

(1)

where $Ar_1$ and $Ar_2$ are each independently a substituted or unsubstituted $C_6$-$C_{30}$ aryl group, or a substituted or unsubstituted $C_2$-$C_{30}$ heteroaryl group;

$R_1$, $R_2$, $R_3$, $R_4$, $R_5$, $R_6$, $R_7$, and $R_8$ are each independently hydrogen, a substituted or unsubstituted $C_1$-$C_{20}$ alkyl group, or a substituted or unsubstituted $C_1$-$C_{20}$ alkoxy group;

n is 1, 2 or 3; and

L is selected from the group consisting of a $C_1$-$C_{10}$ alkylphenyl group, a $C_1$-$C_{10}$ alkoxyphenyl group, a halophenyl group, a cyanophenyl group, a dicyanophenyl group, a trifluoromethoxyphenyl group, o-, m-, or p-tolyl group, o-, m- or p-cumenyl group, a mesityl group, a phenoxyphenyl group, a (α,α-dimethylbenzen)phenyl group, a (N,N'-dimethyl)aminophenyl group, a (N,N-diphenyl)aminophenyl group, a ($C_1$-$C_{10}$ alkylcyclohexyl)phenyl group, a (anthracenyl)phenyl group, a $C_1$-$C_{10}$ alkylbiphenyl group, a $C_1$-$C_{10}$ alkoxybiphenyl group, a pentalenyl group, an indenyl group, a $C_1$-$C_{10}$ alkylnaphtyl group, a $C_1$-$C_{10}$ alkoxynaphtyl group, a halonaphtyl group, a cyanonaphtyl group, a biphenylenyl group, a $C_1$-$C_{10}$ alkyl biphenylenyl group, a $C_1$-$C_{10}$ alkoxy biphenylenyl group, an azulenyl group, a heptalenyl group, an acenaphtylenyl group, a phenalenyl group, an anthraquinolyl group, a methylanthryl group, a phenanthrenyl group, a triphenylenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, an ovalenyl group, a $C_{1-10}$ alkyl carbazolyl group, an indolyl group, a purinyl group, a benzimidazolyl group, a benzothiophenyl group, a parathiazinyl group, a pyrroyl group, a pyrazolyl group, an imidazolyl group, an imidazolinyl group, an oxazolyl group, a thiozolyl group, a triazolyl group, a tetrazolyl group, an oxadiazolyl group, a pyridazinyl group, a pyrimidinyl group, a pyrazinyl group, a thianthrenyl group, a cyclopentyl group, a cyclohexyl group, a $C_1$-$C_{10}$ alkylcyclohexyl group, a $C_1$-$C_{10}$ alkoxycyclohexyl group, an oxyranyl group, a pyrrolidinyl group, a pyrazolidinyl group, an imidazolidinyl group, a piperidinyl group, a piperazinyl group, and a morpholinyl group.

2. The aminostyryl compound of claim 1, wherein substituents of the substituted $C_6$-$C_{30}$ aryl group, the substituted $C_2$-$C_{30}$ heteroaryl group, the substituted $C_1$-$C_{20}$ alkyl group, the substituted $C_1$-$C_{20}$ alkoxy group, comprise at least one selected from the group consisting of —F, —Cl, —Br, —CN, —NO$_2$, —OH, a $C_1$-$C_{20}$ alkyl group that is unsubstituted or substituted with —F, —Cl, —Br, —CN, —NO$_2$ or —OH, a $C_1$-$C_{20}$ alkoxy group that is unsubstituted or substituted with —F, —Cl, —Br, —CN, —NO$_2$ or —OH, a $C_6$-$C_{30}$ aryl group that is unsubstituted or substituted with —F, —Cl, —Br, —CN, —NO$_2$ or —OH, a $C_2$-$C_{30}$ heteroaryl group that is unsubstituted or substituted with —F, —Cl, —Br, —CN, —NO$_2$ or —OH, a $C_5$-$C_{20}$ cycloalkyl group that is unsubstituted or substituted with —F, —Cl, —Br, —CN, —NO$_2$ or —OH, and a $C_5$-$C_{30}$ heterocycloalkyl group that is unsubstituted or substituted with —F, —Br, —CN, —NO$_2$ or —OH.

3. The aminostyryl compound of claim 1, wherein Ar$_1$ and Ar$_2$ are each independently selected from the group consisting of a phenyl group, a $C_1$-$C_{10}$ alkylphenyl group, a $C_1$-$C_{10}$ alkoxyphenyl group, a halophenyl group, a cyanophenyl group, a dicyanophenyl group, a trifluoromethoxyphenyl group, o-, m-, or p-tolyl group, o-, m- or p-cumenyl group, a mesityl group, a phenoxyphenyl group, a (α,α-dimethylbenzen)phenyl group, a (N,N'-dimethyl)aminophenyl group, a (N,N-diphenyl)aminophenyl group, a ($C_1$-$C_{10}$ alkylcyclohexyl)phenyl group, a (anthracenyl)phenyl group, a biphenyl group, a $C_1$-$C_{10}$ alkylbiphenyl group, a $C_1$-$C_{10}$ alkoxybiphenyl group, a pentalenyl group, an indenyl group, a naphtyl group, a $C_1$-$C_{10}$ alkylnaphtyl group, a $C_1$-$C_{10}$ alkoxynaphtyl group, a halonaphtyl group, a cyanonaphtyl group, a biphenylenyl group, a $C_1$-$C_{10}$ alkyl biphenylenyl group, a $C_1$-$C_{10}$ alkoxy biphenylenyl group, an anthracenyl group, an azulenyl group, a heptalenyl group, an acenaphtylenyl group, a phenalenyl group, a fluorenyl group, an anthraquinolyl group, a methylanthryl group, a phenanthrenyl group, a triphenylenyl group, a pyrenyl group, a chrysenyl group, an ethylchrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, an ovalenyl group, a carbazolyl group, a $C_{1-10}$ alkyl carbazolyl group, a thiophenyl group, an indolyl group, a purinyl group, a benzimidazolyl group, a quinolinyl group, a benzothiophenyl group, a parathiazinyl group, a pyrroyl group, a pyrazolyl group, an imidazolyl group, an imidazolinyl group, an oxazolyl group, a thiozolyl group, a triazolyl group, a tetrazolyl group, an oxadiazolyl group, a pyridinyl group, a pyridazinyl group, a pyrimidinyl group, a pyrazinyl group, and a thianthrenyl group.

4. The aminostyryl compound of claim 1, wherein n is one of 1 or 2.

5. The aminostyryl compound of claim 1, represented by one of the following formulas:

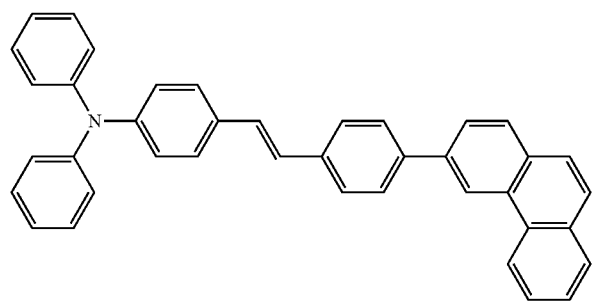

(5)

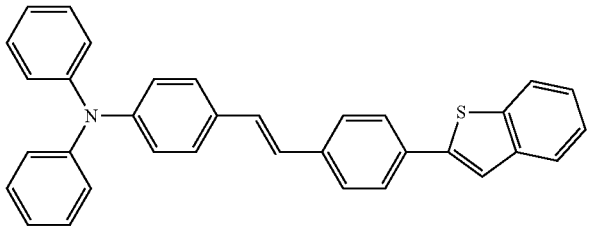

(7)

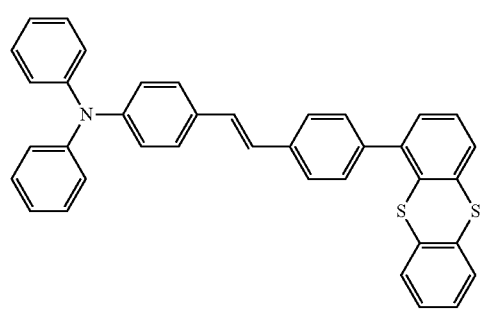

(8)

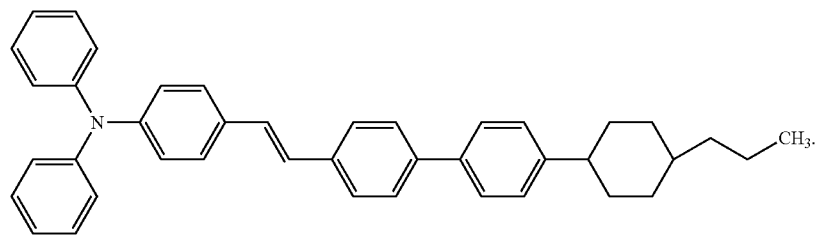

(10)

6. An organic light emitting device comprising at least an organic layer interposed between a first electrode and a second electrode, said at least an organic layer formed of the aminostyryl compound of claim 1.

7. A method of preparing a compound represented by Formula 1 of claim 1, the method comprising:

reacting a compound represented by Formula 1a with a compound represented by Formula 1b to produce a compound represented by Formula 1c; and reacting the compound represented by Formula 1c with compounds represented by Formula 1d to produce the compound represented by Formula 1:

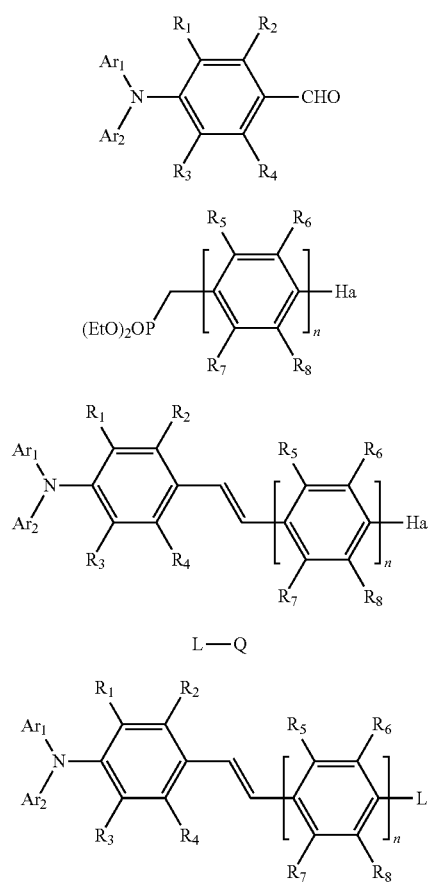

where $Ar_1$ and $Ar_2$ are each independently a substituted or unsubstituted $C_6$-$C_{30}$ aryl group, or a substituted or unsubstituted $C_2$-$C_{30}$ heteroaryl group;

$R_1$, $R_2$, $R_3$, $R_4$, $R_5$, $R_6$, $R_7$, and $R_8$ are each independently hydrogen, a substituted or unsubstituted $C_1$-$C_{20}$ alkyl group, or a substituted or unsubstituted $C_1$-$C_{20}$ alkoxy group;

n is 1, 2 or 3;

L is a substituted or unsubstituted $C_6$-$C_{30}$ aryl group, a substituted or unsubstituted $C_2$-$C_{30}$ heteroaryl group, a substituted or unsubstituted $C_5$-$C_{20}$ cycloalkyl group, or a substituted or unsubstituted $C_5$-$C_{30}$ heterocycloalkyl group;

Ha is halogen; and

Q is a B-containing group.

8. The method of claim 7, wherein Q is one of

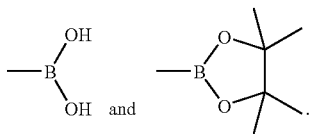

9. The method of claim 7, wherein the aminostyryl compound is represented by one of the following formula:

(3)

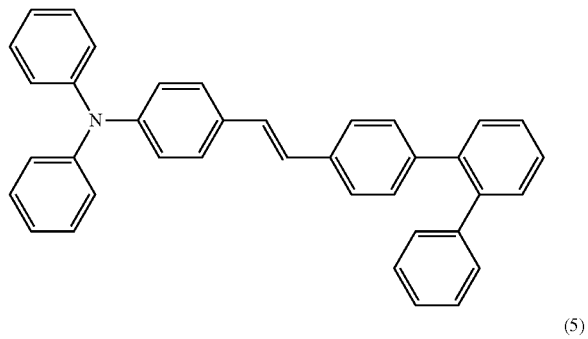

(5)

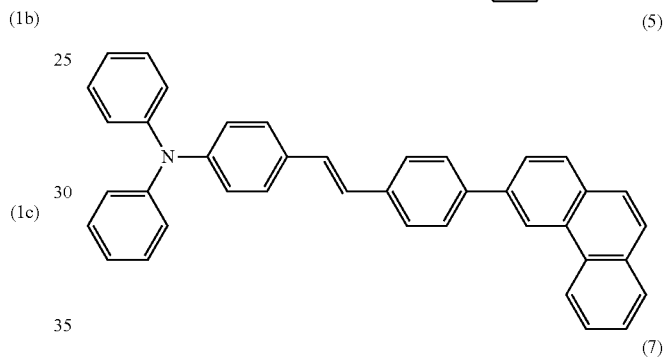

(7)

(8)

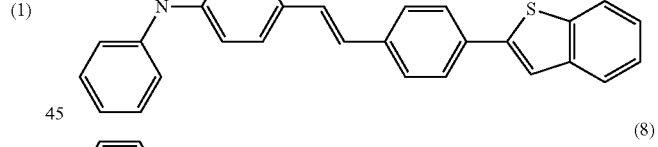

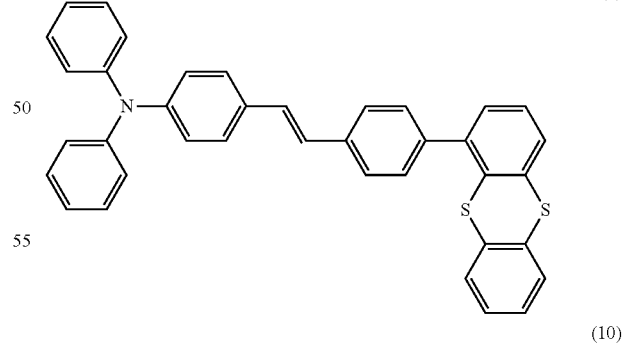

(10)

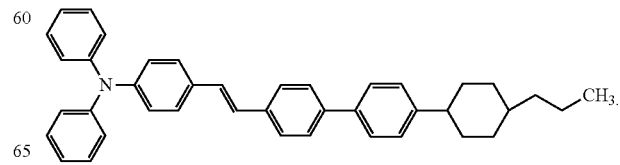

10. A compound prepared by the method of claim 7.

11. An organic light emitting device, comprising:
a first electrode;
a second electrode; and
at least an organic layer interposed between the first electrode and the second electrode, said at least an organic layer comprising an organic layer formed of an aminostyryl compound represented by Formula 1:

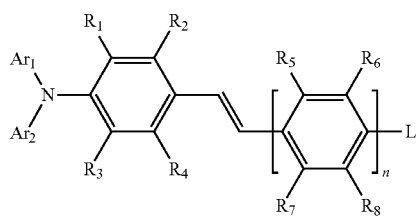

(1)

where $Ar_1$ and $Ar_2$ are each independently a substituted or unsubstituted $C_6$-$C_{30}$ aryl group, or a substituted or unsubstituted $C_2$-$C_{30}$ heteroaryl group;
$R_1$, $R_2$, $R_3$, $R_4$, $R_5$, $R_6$, $R_7$, and $R_8$ are each independently hydrogen, a substituted or unsubstituted $C_1$-$C_{20}$ alkyl group, or a substituted or unsubstituted $C_1$-$C_{20}$ alkoxy group;
n is 1, 2 or 3; and
L selected from the group consisting of a $C_1$-$C_{10}$ alkylphenyl group, a $C_1$-$C_{10}$ alkoxyphenyl group, a halophenyl group, a cyanophenyl group, a dicyanophenyl group, a trifluoromethoxyphenyl group, o-, m-, or p-tolyl group, o-, m- or p-cumenyl group, a mesityl group, a phenoxyphenyl group, a (α,α-dimethylbenzen)phenyl group, a (N,N'-dimethyl)aminophenyl group, a (N,N-diphenyl)aminophenyl group, a ($C_1$-$C_{10}$ alkylcyclohexyl)phenyl group, a (anthracenyl)phenyl group, a $C_1$-$C_{10}$ alkylbiphenyl group, a $C_1$-$C_{10}$ alkoxybiphenyl group, a pentalenyl group, an indenyl group, a $C_1$-$C_{10}$ alkylnaphtyl group, a $C_1$-$C_{10}$ alkoxynaphtyl group, a halonaphtyl group, a cyanonaphtyl group, a biphenylenyl group, a $C_1$-$C_{10}$ alkyl biphenylenyl group, a $C_1$-$C_{10}$ alkoxy biphenylenyl group, an azulenyl group, a heptalenyl group, an acenaphtylenyl group, a phenalenyl group, an anthraquinolyl group, a methylanthryl group, a phenanthrenyl group, a triphenylenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, an ovalenyl group, a $C_{1-10}$ alkyl carbazolyl group, an indolyl group, a purinyl group, a benzimidazolyl group, a benzothiophenyl group, a parathiazinyl group, a pyrroyl group, a pyrazolyl group, an imidazolyl group, an imidazolinyl group, an oxazolyl group, a thiozolyl group, a triazolyl group, a tetrazolyl group, an oxadiazolyl group, a pyridazinyl group, a pyrimidinyl group, a pyrazinyl group, a thianthrenyl group, a cyclopentyl group, a cyclohexyl group, a $C_1$-$C_{10}$ alkylcyclohexyl group, a $C_1$-$C_{10}$ alkoxycyclohexyl group, an oxyranyl group, a pyrrolidinyl group, a pyrazolidinyl group, an imidazolidinyl group, a piperidinyl group, a piperazinyl group, and a morpholinyl group.

12. The organic light emitting device of claim 11, wherein the organic layer formed of the aminostyryl compound is an emissive layer.

13. The organic light emitting device of claim 11, wherein the organic layer formed of the aminostyryl compound is a hole transport layer.

14. The organic light emitting device of claim 11, wherein said at least one organic layer comprises at least one layer selected from the group consisting of a hole injection layer, a hole transport layer, an electron blocking layer, a hole blocking layer, an electron transport layer, and an electron injection layer.

15. The organic light emitting device of claim 11, wherein said at least one organic layer comprises a hole injection layer formed on the first electrode, an emissive layer formed on the hole injection layer, an electron transport layer formed on the emissive layer, an electron injection layer formed on the electron transport layer.

16. The organic light emitting device of claim 15, wherein said at least one organic layer further comprises a hole transport layer between the hole injection layer and the emissive layer.

17. The organic light emitting device of claim 16, wherein said at least one organic layer further comprises a hole blocking layer between the emissive layer and the electron transport layer.

18. The organic light emitting device of claim 12, wherein the emissive layer comprises at least one dopant selected from the group consisting of a red phosphorescent dopant, a green phosphorescent dopant, a blue phosphorescent dopant, a white phosphorescent dopant, a red fluorescent dopant, a green fluorescent dopant, a blue fluorescent dopant, and a white fluorescent dopant.

19. The organic light emitting device of claim 11, wherein the aminostyryl compound is represented by one of the following formulas:

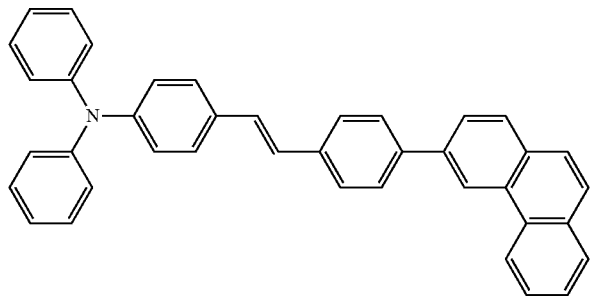

(5)

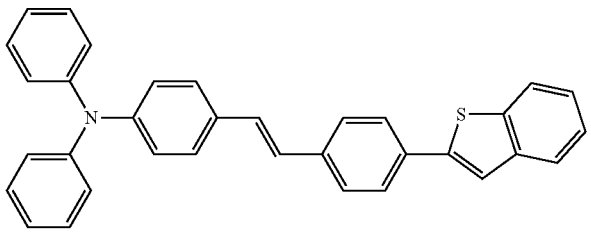

(7)

-continued
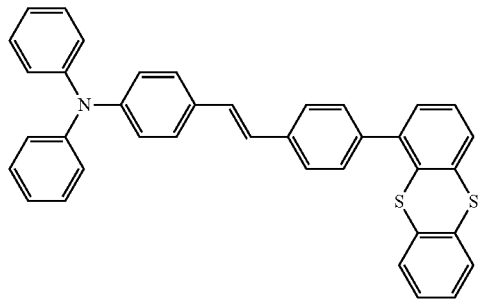
(8)
(10)
* * * * *